(12) United States Patent
Kobayashi

(10) Patent No.: US 8,866,220 B2
(45) Date of Patent: Oct. 21, 2014

(54) SEMICONDUCTOR DEVICE

(71) Applicant: Kabushiki Kaisha Toshiba, Tokyo (JP)

(72) Inventor: Hitoshi Kobayashi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/786,331

(22) Filed: Mar. 5, 2013

(65) Prior Publication Data

US 2014/0027845 A1    Jan. 30, 2014

(30) Foreign Application Priority Data

Jul. 27, 2012    (JP) ................. 2012-167696

(51) Int. Cl.
*H01L 29/66* (2006.01)
*H01L 29/78* (2006.01)
*H01L 29/423* (2006.01)
*H01L 29/36* (2006.01)

(52) U.S. Cl.
CPC ............ *H01L 29/7827* (2013.01); *H01L 29/78* (2013.01); *H01L 29/423* (2013.01); *H01L 29/36* (2013.01)
USPC ....................................... 257/331

(58) Field of Classification Search
CPC ... H01L 29/402; H01L 29/404; H01L 29/405; H01L 29/407; H01L 29/4236; H01L 29/42336; H01L 29/42364; H01L 29/10823; H01L 29/7396; H01L 29/7397; H01L 29/7813
USPC ................................. 257/330–332
See application file for complete search history.

(56) References Cited

U.S. PATENT DOCUMENTS

2009/0008709 A1*   1/2009   Yedinak et al. ................ 257/331
2011/0318894 A1   12/2011   Kobayashi et al.
2012/0199899 A1*   8/2012   Kobayashi et al. ........... 257/330

FOREIGN PATENT DOCUMENTS

JP   2011-199061 A   10/2011
WO   02/058160 A1    7/2002
WO   2005/065385 A2  7/2005

* cited by examiner

*Primary Examiner* — Brook Kebede

(74) *Attorney, Agent, or Firm* — Holtz, Holtz, Goodman & Chick PC

(57) ABSTRACT

According to one embodiment, a semiconductor device includes a semiconductor section, a control electrode, and a first electrode. The semiconductor section extends in a first direction. The control electrode is provided across a first insulating film from the semiconductor section in a second direction. The semiconductor section includes first, second, third, and fourth semiconductor regions. The first semiconductor region has a first conductivity type. The second semiconductor region has a second conductivity type, and is provided on the first semiconductor region to oppose the control electrode. The third semiconductor region has the first conductivity type, and is provided on the second semiconductor region. The fourth semiconductor region has the second conductivity type, and is provided together with the third semiconductor region. The first electrode is provided on the semiconductor section. The fourth semiconductor region is provided displaced to opposite side of the semiconductor section from the control electrode.

17 Claims, 15 Drawing Sheets

SEMICONDUCTOR DEVICE

CROSS-REFERENCE TO RELATED APPLICATIONS

This application is based upon and claims the benefit of priority from the prior Japanese Patent Application No. 2012-167696, filed on Jul. 27, 2012; the entire contents of which are incorporated herein by reference.

FIELD

Embodiments described herein relate generally to a semiconductor device.

BACKGROUND

A transistor of the trench gate structure includes a gate electrode extending in the depth direction of the semiconductor region. In the transistor of the trench gate structure, the device area can be made smaller than in the transistor of the planar gate structure. For instance, in a MOS (metal oxide semiconductor) transistor of the trench gate structure, a source region, a base region, and a drift region are provided in a pillar-shaped semiconductor section adjacent to the trench gate structure. Furthermore, in the semiconductor section, a high concentration region having high impurity concentration is provided together with the source region.

In such a semiconductor device, with the miniaturization of the pillar-shaped semiconductor section, the positional accuracy of the high concentration region provided in the semiconductor section becomes important. That is, if the high concentration region is misaligned, impurity contained in the high concentration region affects the base region and causes variation in characteristics. In semiconductor devices, it is important to achieve stable characteristics.

DETAILED DESCRIPTION

Figure 1:
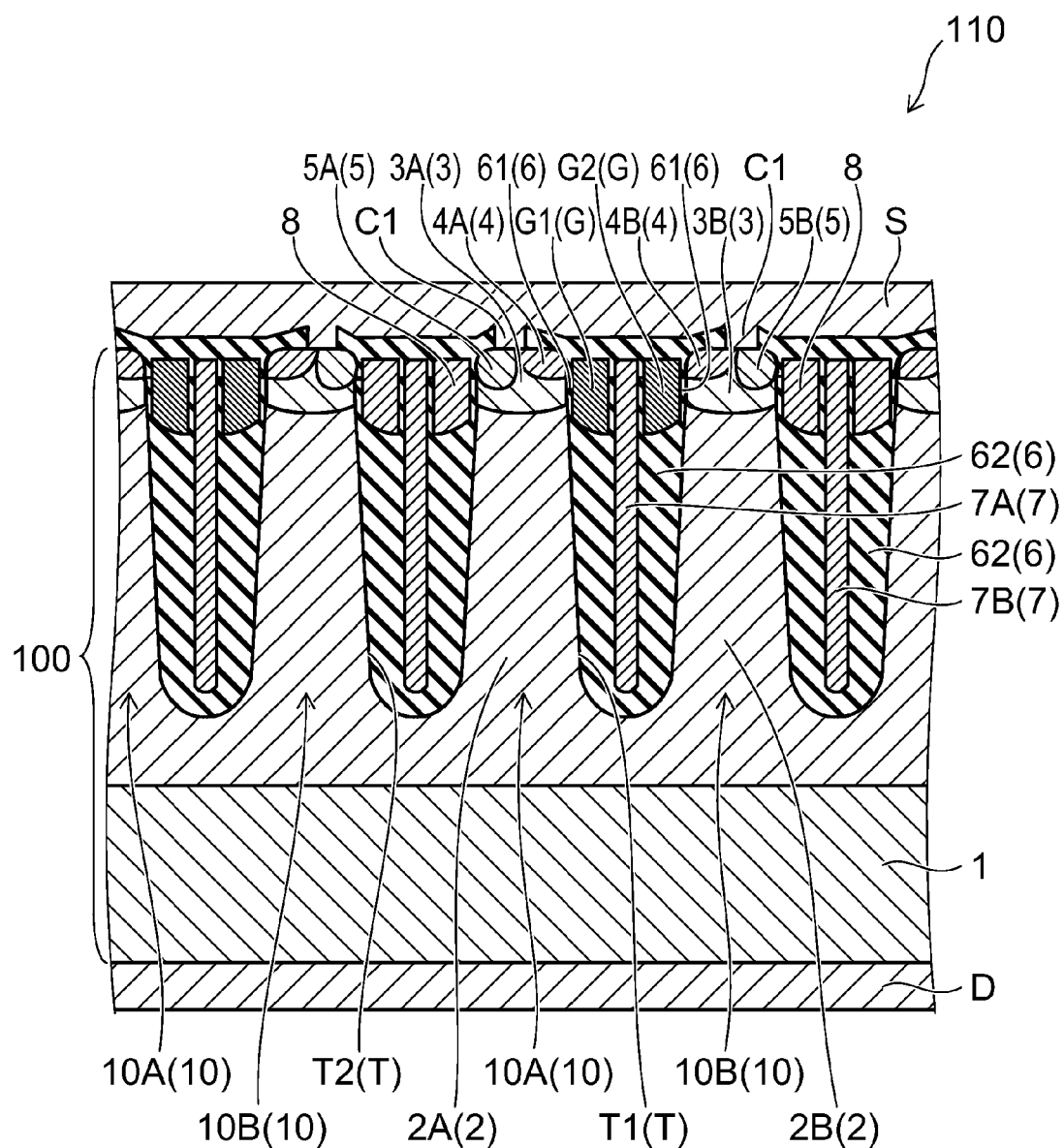
FIG. 1 is a schematic sectional view illustrating the configuration of a semiconductor device according to a first embodiment.

According to one embodiment, a semiconductor device includes a semiconductor section, a control electrode, and a first electrode. The semiconductor section extends in a first direction. The control electrode is provided across a first insulating film from the semiconductor section in a second direction orthogonal to the first direction. The semiconductor section includes a first semiconductor region, a second semiconductor region, a third semiconductor region, and a fourth semiconductor region. The first semiconductor region has a first conductivity type. The second semiconductor region has a second conductivity type, and is provided on the first semiconductor region and is opposed to the control electrode. The third semiconductor region has the first conductivity type, and is provided on the second semiconductor region. The fourth semiconductor region has the second conductivity type, and is provided on the second semiconductor region and has an impurity concentration higher than an impurity concentration of the second semiconductor region. The first electrode is provided on the semiconductor section. The fourth semiconductor region is provided displaced to opposite side of the semiconductor section from the control electrode.

Various embodiments will be described hereinafter with reference to the accompanying drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the specification and the drawings, components similar to those described previously with reference to earlier figures are labeled with like reference numerals, and the detailed description thereof is omitted appropriately.

In the following description, by way of example, the first conductivity type is n-type, and the second conductivity type is p-type.

In the following description, the notations of $n^+$, $n$, $n^-$ and $p^+$, $p$, $p^-$ represent relative magnitude of impurity concentration in each conductivity type. That is, $n^+$ represents relatively higher n-type impurity concentration than $n$, and $n^-$ represents relatively lower n-type impurity concentration than $n$. Similarly, $p^+$ represents relatively higher p-type impurity concentration than $p$, and $p^-$ represents relatively lower p-type impurity concentration than $p$.

First Embodiment

FIG. 1 is a schematic sectional view illustrating the configuration of a semiconductor device according to a first embodiment.

The semiconductor device 110 according to the first embodiment includes a semiconductor pillar (semiconductor section) 10, a gate electrode (control electrode) G, and a source electrode (first electrode) S. The semiconductor device 110 includes an $n^+$-type drain layer 1 and a drain electrode D continuous with the $n^+$-type drain layer 1. The semiconductor device 110 is e.g. a MOS transistor.

The semiconductor pillar 10 is provided on the $n^+$-type drain layer 1. In the embodiments, the direction connecting the $n^+$-type drain layer 1 and the semiconductor pillar 10 is referred to as Z direction (first direction). One direction orthogonal to the Z direction is referred to as X direction (second direction). The direction orthogonal to the Z direction and the X direction is referred to as Y direction (third direction). Furthermore, in the embodiments, the direction from the $n^+$-type drain layer 1 toward the semiconductor pillar 10 is referred to by using "on" or "above" (upper side), and the opposite direction is referred to by using "below" (lower side).

The semiconductor pillar 10 extends in the Z direction. In the semiconductor device 110, a plurality of semiconductor pillars 10 are spaced in the X direction. One of the plurality of semiconductor pillars 10 is referred to as first semiconductor pillar 10A. A semiconductor pillar 10 adjacent to the first semiconductor pillar 10A is referred to as second semiconductor pillar 10B. When the semiconductor pillars 10A, 10B are not distinguished, they are generally referred to as semiconductor pillars 10. In the semiconductor device 110, a plurality of semiconductor pillars 10A and a plurality of semiconductor pillars 10B are disposed alternately in the X direction. The semiconductor pillar 10 extends not only in the Z direction but also in the Y direction.

The semiconductor pillar 10 includes an $n^-$-type drift layer (first semiconductor region) 2, a p-type base layer (second semiconductor region) 3, an $n^+$-type source layer (third semiconductor region) 4, and a $p^+$-type contact layer (fourth semiconductor region) 5.

More specifically, the first semiconductor pillar 10A includes an $n^-$-type drift layer (first first semiconductor region) 2A, a p-type base layer (first second semiconductor region) 3A, an $n^+$-type source layer (first third semiconductor region) 4A, and a $p^+$-type contact layer (first fourth semiconductor region) 5A. The second semiconductor pillar 10B includes an $n^-$-type drift layer (second first semiconductor region) 2B, a p-type base layer (second second semiconductor region) 3B, an $n^+$-type source layer (second third semiconductor region) 4B, and a $p^+$-type contact layer (second fourth semiconductor region) 5B.

Here, when the $n^-$-type drift layers 2A and 2B are not distinguished, they are generally referred to as $n^-$-type drift layers 2. When the p-type base layers 3A and 3B are not distinguished, they are generally referred to as p-type base layers 3. When the $n^+$-type source layers 4A and 4B are not distinguished, they are generally referred to as $n^+$-type source layers 4. When the $p^+$-type contact layers 5A and 5B are not distinguished, they are generally referred to as $p^+$-type contact layers 5.

The $n^-$-type drift layer 2 is in contact with the $n^+$-type drain layer 1. The $n^-$-type drift layer 2 is provided on the lower side of the semiconductor pillar 10. The p-type base layer 3 is provided on the $n^-$-type drift layer 2. The p-type base layer 3 is in contact with the $n^-$-type drift layer 2. The p-type base layer 3 is opposed to the gate electrode G across a gate insulating film 61.

The $n^+$-type source layer 4 is provided on the p-type base layer 3. The $n^+$-type source layer 4 is in contact with the p-type base layer 3. The impurity concentration of the $n^+$-type source layer 4 is higher than the impurity concentration of the $n^-$-type drift layer 2. The $n^+$-type source layer 4 is exposed from the upper end 101 of the semiconductor pillar 10.

The $p^+$-type contact layer 5 is provided on the p-type base layer 3. The $p^+$-type contact layer 5 is in contact with the p-type base layer 3. The $p^+$-type contact layer 5 is disposed together with the $n^+$-type source layer 4. The impurity concentration of the $p^+$-type contact layer 5 is higher than the impurity concentration of the p-type base layer 3. The $p^+$-type contact layer 5 is exposed from the upper end 101 of the semiconductor pillar 10.

The $n^+$-type drain layer 1, the $n^-$-type drift layer 2, the p-type base layer 3, the $n^+$-type source layer 4, and the $p^+$-type contact layer 5 are made of e.g. a semiconductor layer 100 including silicon. In the semiconductor layer 100, a trench T is provided. The trench T is formed by removing part of the semiconductor layer 100 in the Z direction. The semiconductor pillar 10 is a region of the semiconductor layer 100 remaining after the trench T is formed.

In the semiconductor device 110, a plurality of trenches T are provided in the X direction. An insulating film 6 is provided inside the trench T. One of the plurality of trenches T is referred to as first trench T1. A gate electrode G is provided in the first trench T1. One of the plurality of trenches T adjacent to the first trench T1 is referred to as second trench T2. A conductive portion 8 is provided in the second trench T2. Here, when the first trench T1 and the second trench T2 are not distinguished, they are generally referred to as trenches T. In the semiconductor device 110, a plurality of first trenches T1 and a plurality of second trenches T2 are provided alternately in the X direction.

In the first trench T1, a first field plate electrode 7A, a first gate electrode G1, and a second gate electrode G2 are provided via the insulating film 6. In the second trench T2, a second field plate electrode 7B, a first conductive portion 8A, and a second conductive portion 8B are provided via the insulating film 6.

Here, when the first field plate electrode 7A and the second field plate electrode 7B are not distinguished, they are generally referred to as field plate electrodes 7. When the first gate electrode G1 and the second gate electrode G2 are not distinguished, they are generally referred to as gate electrodes G. When the first conductive portion 8A and the second conductive portion 8B are not distinguished, they are generally referred to as conductive portions 8.

The field plate electrode 7 is disposed in the central portion in the X direction of the trench T. The field plate electrode 7 extends in the Z direction in the trench T. The lower end of the field plate electrode 7 (the end portion on the $n^+$-type drain layer 1 side) is provided below the lower end of the gate electrode G.

The first field plate electrode 7A is provided between the first semiconductor pillar 10A and the second semiconductor pillar 10B. The second field plate electrode 7B is provided on the opposite side of the first semiconductor pillar 10A from the first gate electrode G1. The second field plate electrode 7B is spaced from the first semiconductor pillar 10A.

The first gate electrode G1 provided in the first trench T1 is spaced from the first semiconductor pillar 10A in the X direction. The second gate electrode G2 provided in the first trench T1 is provided between the second semiconductor pillar 10B and the first field plate electrode 7A. The second gate electrode G2 is spaced from the second semiconductor pillar 10B and the first field plate electrode 7A. In the first trench T1, the insulating film 6 provided between the gate electrode G and the semiconductor pillar 10 is a gate insulating film 61. The gate electrode G is opposed to the p-type base layer 3 across the gate insulating film 61.

In the trench T, the insulating film 6 provided between the field plate electrode 7 and the semiconductor pillar 10 is a field plate insulating film 62. The thickness of the field plate insulating film 62 (the spacing in the X direction between the field plate electrode 7 and the semiconductor pillar 10) is larger than the thickness of the gate insulating film 61 (the spacing in the X direction between the gate electrode G and the p-type base layer 3).

The source electrode S is continuous with the $n^+$-type source layer 4 and the $p^+$-type contact layer 5. The source electrode S is provided e.g. above the semiconductor layer 100. A first contact portion C1 is provided between the source electrode S and the $n^+$-type source layer 4A, and between the source electrode S and the $p^+$-type contact layer 5A. A first contact portion C1 is provided also between the source electrode S and the $n^+$-type source layer 4B, and between the source electrode S and the $p^+$-type contact layer 5B. That is, the n+-type source layer 4 and the p+-type contact layer 5 are continuous with the source electrode S via the first contact portion C1.

The operation of the semiconductor device 110 is now described.

The drain electrode D is applied with a positive voltage relative to the source electrode S. In this state, a voltage higher than or equal to the threshold is applied to the gate electrode G. Then, an inversion layer (channel) is formed near the interface of the p-type base layer 3 with the gate insulating film 61. Thus, the semiconductor device 110 is turned on. Accordingly, a current flows from the drain electrode D to the source electrode S.

On the other hand, if the voltage applied to the gate electrode G is lower than the threshold, the channel vanishes. Thus, the semiconductor device 110 is turned off. Accordingly, the current flowing from the drain electrode D to the source electrode S is blocked. Furthermore, when the semiconductor device 110 is in the OFF state, holes in the p-type base layer 3 flow through the p+-type contact layer 5 to the source electrode S. This improves the avalanche withstand capability of the semiconductor device 110.

In the semiconductor device 110, the field plate electrode 7 is placed at an electrically floating potential, or is equipotential with the n+-type source layer 4. Such a field plate electrode 7 relaxes electric field concentration in the depth direction (Z direction) of the trench T. This increases the breakdown voltage of the semiconductor device 110.

The conductive portion 8 is placed at an electrically floating potential, or is equipotential with the n+-type source layer 4. That is, the conductive portion 8 is not equipotential with the gate electrode G, and does not function as a gate. Thus, the conductive portion 8 not functioning as a gate is provided in a subset of the plurality of trenches T. This makes the input capacitance $C_{iss}$ lower than in the case where the gate electrode G is provided in all the trenches T.

Here, if the field plate electrode 7 and the gate electrode G are spaced from each other in the trench T, and the field plate electrode 7 is equipotential with the n+-type source layer 4, then a gate-source capacitance occurs between the gate electrode G and the n+-type source layer 4, and between the gate electrode G and the field plate electrode 7. The gate-source capacitance is part of the input capacitance $C_{iss}$. The gate-source capacitance accounts for a large proportion of the overall input capacitance $C_{iss}$.

In contrast, if the conductive portion 8 in the trench T is made equipotential with the n+-type source layer 4, no gate-source capacitance occurs with regard to that trench T. Thus, the conductive portion 8 is provided in a subset of the plurality of trenches T and made equipotential with the n+-type source layer 4. Accordingly, no gate-source capacitance occurs in that trench T. This reduces the input capacitance $C_{iss}$ of the semiconductor device 110 as a whole.

In the semiconductor device 110 according to the embodiment, the p+-type contact layer 5 is displaced to the opposite side of the semiconductor pillar 10 from the gate electrode G. For instance, in the first semiconductor pillar 10A, the p+-type contact layer 5A is displaced to the opposite side of the first semiconductor pillar 10A from the first gate electrode G1. In the second semiconductor pillar 10B, the p+-type contact layer 5B is displaced to the opposite side of the second semiconductor pillar 10B from the second gate electrode G2.

Figure 2A:
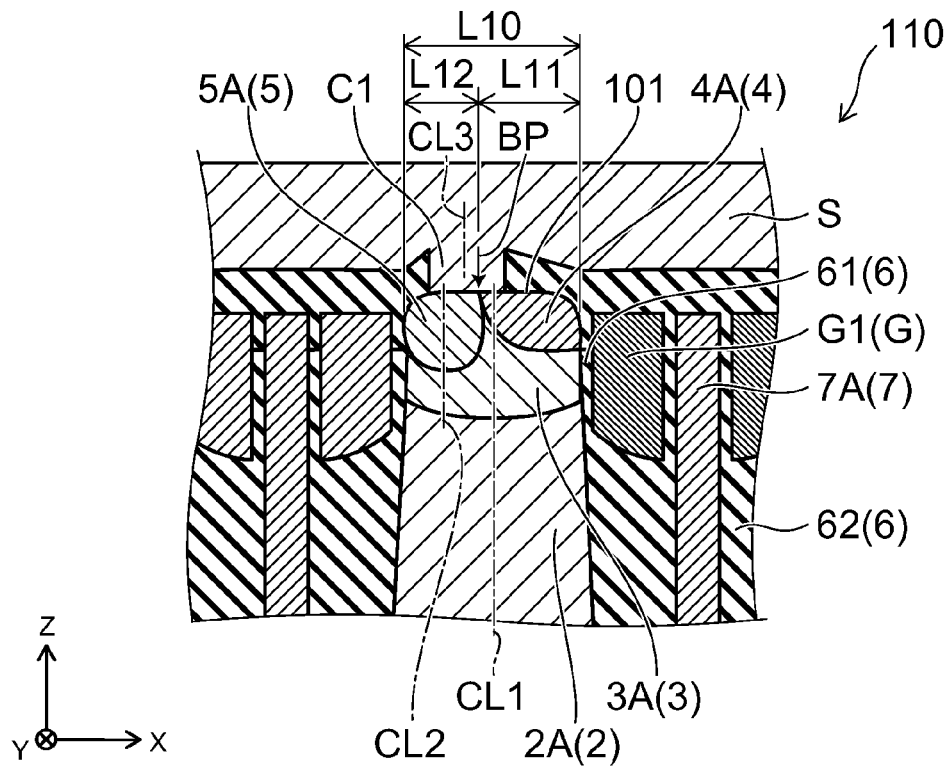
FIGS. 2A and 2B are schematic sectional views illustrating the configuration of a semiconductor pillar.
Figure 2B:
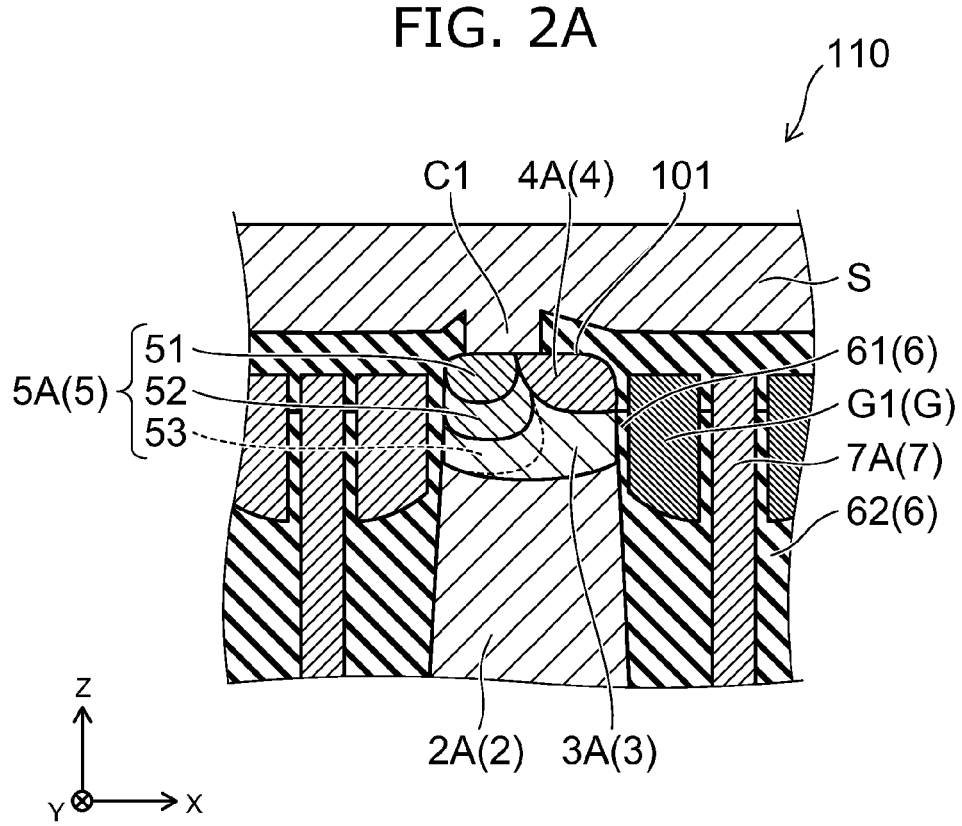

FIGS. 2A and 2B are schematic sectional views illustrating the configuration of the semiconductor pillar.

FIGS. 2A and 2B show schematic cross sections enlarging the portion of the upper end 101 of the semiconductor pillar 10. FIG. 2A shows a first configuration example of the semiconductor pillar 10. FIG. 2B shows a second configuration example of the semiconductor pillar 10. While FIGS. 2A and 2B illustrate the first semiconductor pillar 10A, the same also applies to the second semiconductor pillar 10B.

As shown in FIG. 2A, in the first semiconductor pillar 10A, the p+-type contact layer 5A is displaced to the opposite side of the first semiconductor pillar 10A from the first gate electrode G1. Here, the meaning of "the p+-type contact layer 5A is displaced" is as follows. The center position in the X direction of the p+-type contact layer 5A at the upper end 101 of the first semiconductor pillar 10A is denoted by CL2. The center position in the X direction of the upper end 101 as a whole is denoted by CL1. Then, "the p+-type contact layer 5A is displaced" means that the center position CL2 is displaced away from the first gate electrode G1 with respect to the center position CL1.

Examples of the displaced state are listed below.

(1) The length L11 in the X direction of the n+-type source layer 4A at the upper end 101 of the first semiconductor pillar 10A is half or more of the length L10 in the X direction of the upper end 101.

(2) The length L12 in the X direction of the p+-type contact layer 5A at the upper end 101 is half or less of the length L10.

(3) The boundary position BP between the n+-type source layer 4A and the p+-type contact layer 5A at the upper end 101 is located away from the first gate electrode G1 by half or more of the length in the X direction of the upper end 101.

In the semiconductor device 110, the first contact portion C1 may be displaced to the opposite side of the first semiconductor pillar 10A from the first gate electrode G1. Here, the meaning of "the first contact portion C1 is displaced" is as follows. The center position in the X direction of the contact portion between the first contact portion C1 and the upper end 101 is denoted by CL3. Then, "the first contact portion C1 is displaced" means that the center position CL3 is displaced away from the first gate electrode G1 with respect to the center position CL1.

As illustrated in (1)-(3) described above, the p+-type contact layer 5A is displaced to the opposite side of the first semiconductor pillar 10A from the first gate electrode G1. This suppresses the influence on the p-type base layer 3A exerted by impurity contained in the p+-type contact layer 5A.

Specifically, if the p+-type contact layer 5A is displaced to the opposite side of the first semiconductor pillar 10A from the first gate electrode G1, the length between the p+-type contact layer 5A and the channel formation region is made longer than in the case of no displacement. As this length becomes longer, the influence on the channel formation region exerted by the impurity of the p+-type contact layer 5 is reduced. This stabilizes the threshold and other characteristics of the semiconductor device 110.

In the semiconductor device 110 according to the embodiment, the first trench T1 provided with the gate electrode G and the second trench T2 provided with the conductive portion 8 are adjacent to each other. Thus, because the p+-type contact layer 5 is displaced to the opposite side of the semiconductor pillar 10 from the gate electrode G, the p+-type contact layer 5 is located away from the gate electrode G, but comes close to the conductive portion 8. However, the conductive portion 8 does not function as a gate. Thus, even in the ON state, no channel is formed on the conductive portion 8 side of the semiconductor pillar 10. Accordingly, even if the p+-type contact layer 5 is displaced to the opposite side of the semiconductor pillar 10 from the gate electrode G, the operation of the semiconductor device 110 is not affected.

Furthermore, in the semiconductor device 110, the p+-type contact layer 5 is located away from the channel formation region. Thus, the impurity concentration of the $p^+$-type contact layer 5 may be made higher, and the depth of the $p^+$-type contact layer 5 may be made deeper.

The second configuration example of the semiconductor pillar 10 shown in FIG. 2B is different from the first configuration example of the semiconductor pillar 10 shown in FIG. 2A in the impurity concentration and depth of the $p^+$-type contact layer 5. The $p^+$-type contact layer 5 shown in FIG. 2B includes a first region 51 and a second region 52 sequentially in the Z direction from the upper end 101 side. More specifically, in the $p^+$-type contact layer 5 shown in FIG. 2B, the impurity concentration is made gradually lower in the Z direction from the upper end 101. Furthermore, a region (e.g., third region 53) with the impurity concentration further gradually lowered may be provided at a position deeper than the second region 52.

Thus, the impurity concentration of the $p^+$-type contact layer 5 is made higher, and the depth of the $p^+$-type contact layer 5 is made deeper. Accordingly, when the semiconductor device 110 is in the OFF state, holes in the p-type base layer 3 are efficiently ejected to the source electrode S. This improves the avalanche withstand capability.

Next, a method for manufacturing the semiconductor device 110 is described.

FIGS. 3A to 7B are schematic sectional views illustrating the method for manufacturing a semiconductor device.

Figure 3A:
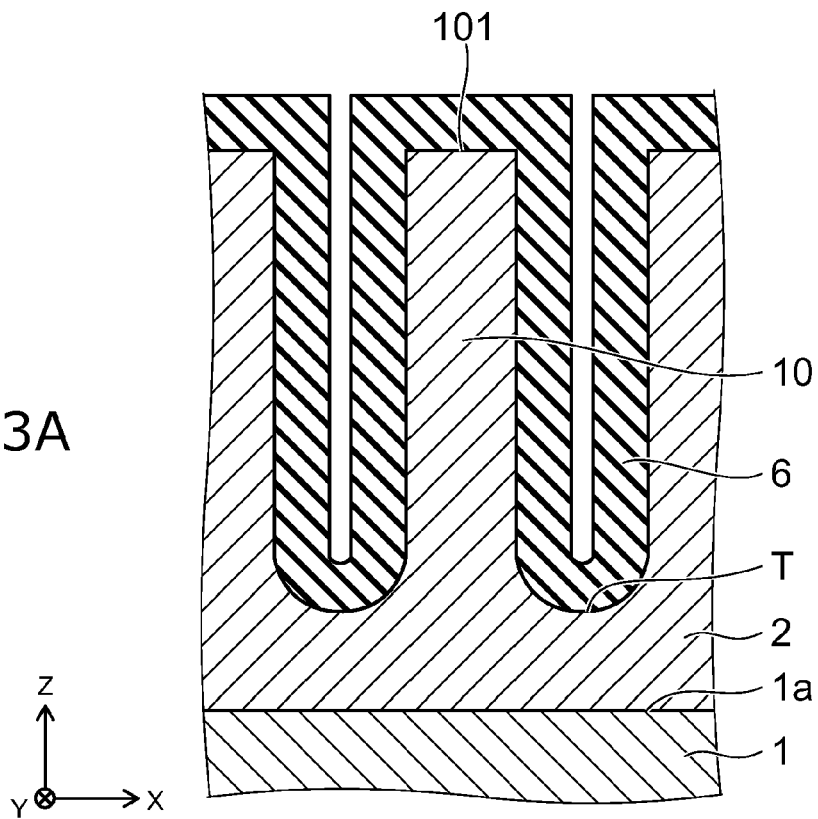
FIG. 3A to FIG. 7B are schematic sectional views illustrating a method for manufacturing the semiconductor device.

First, as shown in FIG. 3A, an $n^+$-type drain layer 1 is prepared. The $n^+$-type drain layer 1 is e.g. a silicon wafer. Next, an $n^-$-type drift layer 2 is formed on the first surface $1a$ of the $n^+$-type drain layer 1. The $n^-$-type drift layer 2 is formed on the first surface $1a$ by e.g. epitaxial growth.

Next, trenches T extending in the Z direction are formed in the $n^-$-type drift layer 2. The trench T is formed by e.g. RIE (Reactive Ion Etching). The depth of the trench T is determined depending on the breakdown voltage of the semiconductor device 110 so that the depletion layer extends to a prescribed depth. For instance, in the case where the breakdown voltage is approximately 100 V, the depth of the trench T from the upper surface $2a$ of the $n^-$-type drift layer 2 is approximately 6 micrometers (μm). For a higher breakdown voltage of the semiconductor device 110, the trench T is formed deeper.

The trenches T are formed in a plurality with a prescribed spacing in the X direction in the $n^-$-type drift layer 2. Thus, a semiconductor pillar 10 is configured between the adjacent trenches T.

After forming the trenches T, a field plate insulating film 62 is formed entirely on the upper end 101 of the semiconductor pillar 10 and the inner surface of the trench T. The field plate insulating film 62 includes e.g. silicon oxide. The silicon oxide is formed by e.g. thermal oxidation technique or CVD (Chemical Vapor Deposition) technique. Alternatively, the field plate insulating film 62 may be made of silicon nitride, silicon oxynitride, or alumina formed by CVD technique.

Figure 3B:
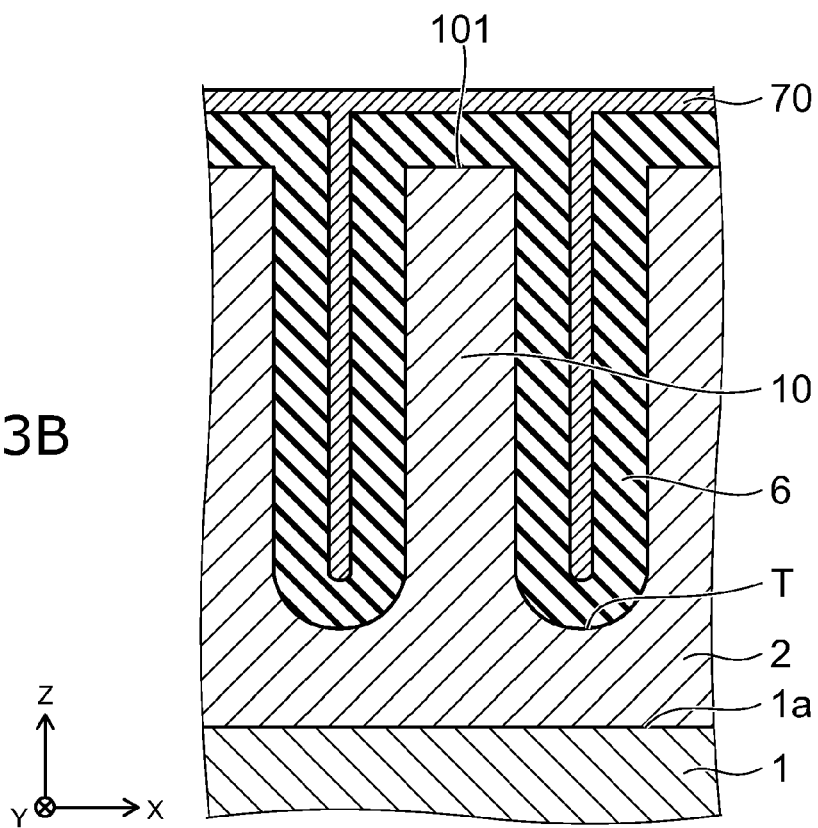

Next, as shown in FIG. 3B, conductive polysilicon 70 is embedded in the trench T by e.g. CVD technique. The conductive polysilicon 70 is embedded in the trench T via the field plate insulating film 62. The conductive polysilicon 70 contains e.g. p-type impurity. Alternatively, the conductive polysilicon 70 may contain n-type impurity.

Figure 4A:
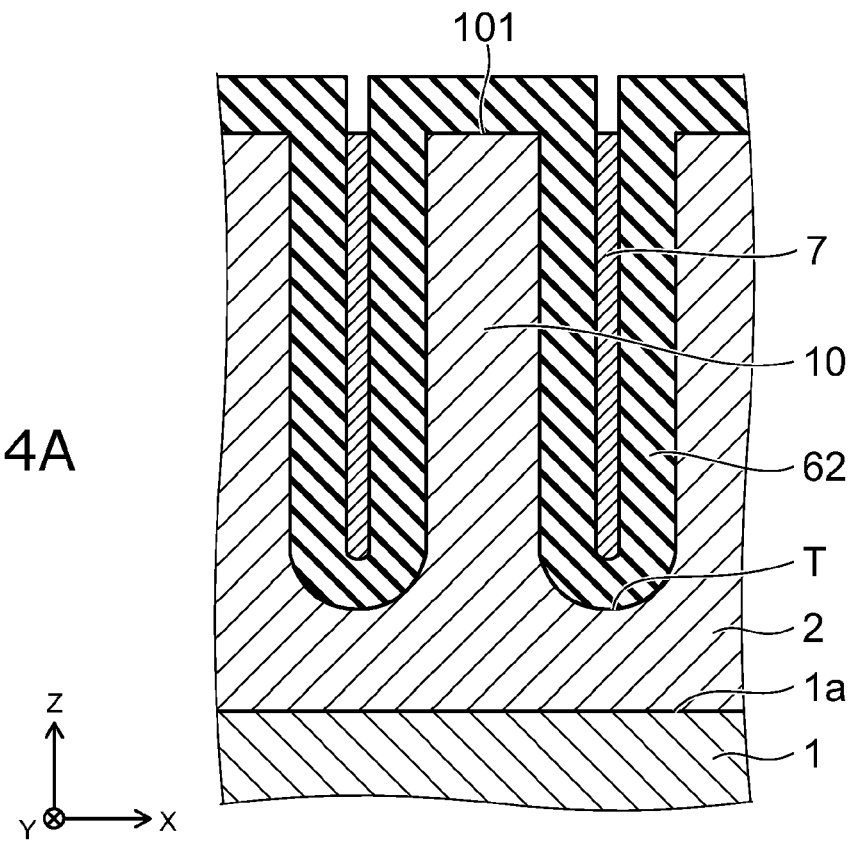

Next, as shown in FIG. 4A, part of the polysilicon 70 is etched by e.g. CDE (Chemical Dry Etching) technique. The polysilicon 70 is etched until its upper end reaches the upper end 101 of the semiconductor pillar 10. As a result, a field plate electrode 7 is formed in the trench T via the field plate insulating film 62.

Figure 4B:
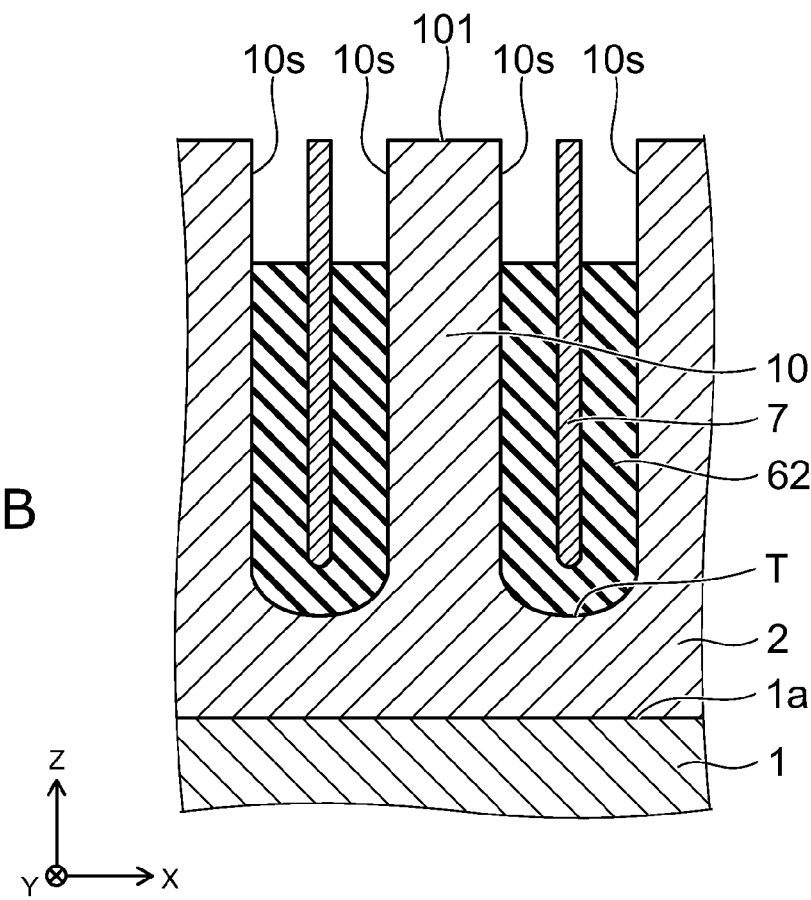

Next, as shown in FIG. 4B, part of the field plate insulating film 62 is etched to set back its upper end. The field plate insulating film 62 is etched until its upper end is located below the lower end of the p-type base layer 3 described later. The field plate insulating film 62 is etched by e.g. wet etching with an etching liquid based on hydrogen fluoride (HF). In this wet etching, the field plate electrode 7 made of polysilicon is scarcely etched. Thus, the field plate insulating film 62 is selectively etched. As a result, the field plate electrode 7 is exposed from the upper end of the field plate insulating film 62 and protrudes to the upper side. Furthermore, part of the side surface $10s$ of the semiconductor pillar 10 is exposed above the field plate insulating film 62.

Figure 5A:
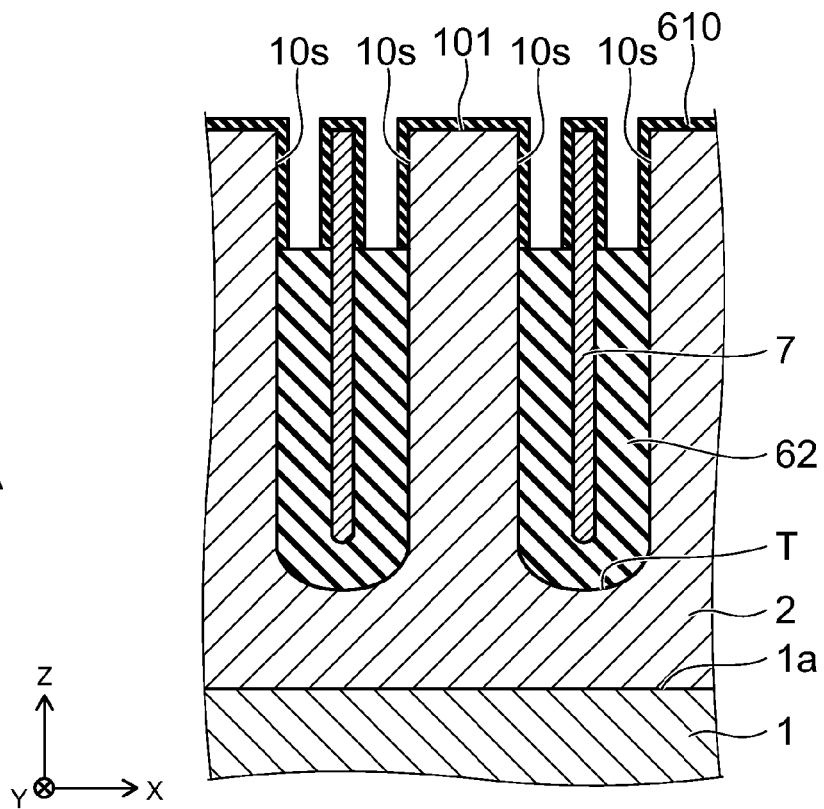

Next, as shown in FIG. 5A, silicon oxide 610 is formed by e.g. thermal oxidation technique. The silicon oxide 610 is formed so as to cover the portion of the field plate electrode 7 exposed from the field plate insulating film 62, and the side surface $10s$ and the upper end 101 of the semiconductor pillar 10. Alternatively, the silicon oxide 610 may be formed by e.g. CVD technique.

Figure 5B:
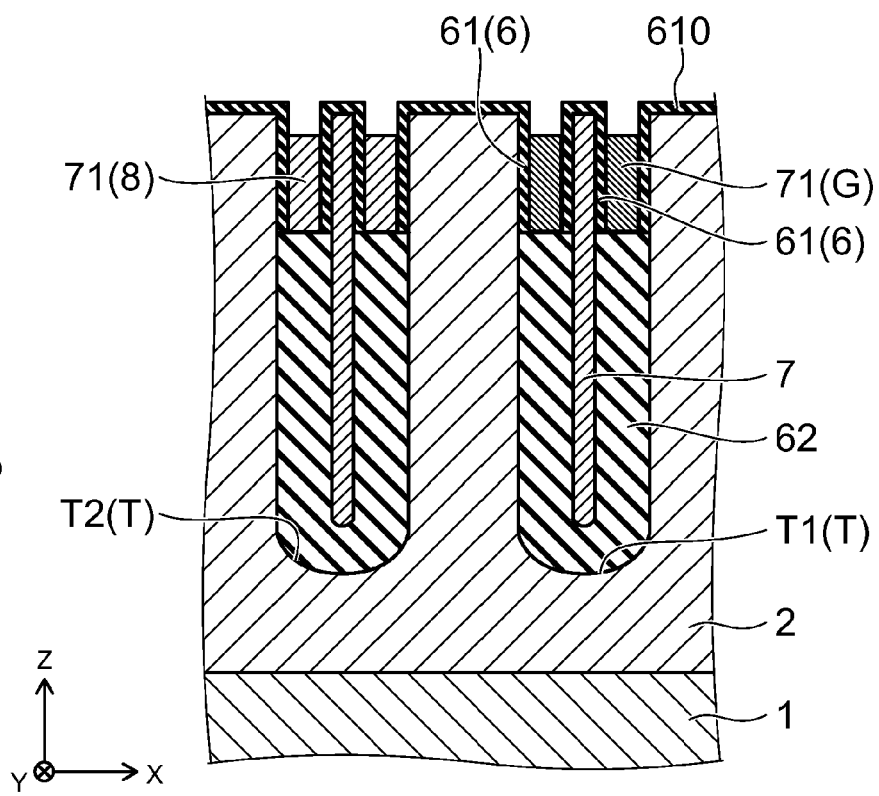

Next, as shown in FIG. 5B, conductive polysilicon 71 is formed on the field plate insulating film 62. The conductive polysilicon 71 is embedded in the trench T by e.g. CVD technique. The conductive polysilicon 71 is adjacent to the semiconductor pillar 10 and the field plate electrode 7 via the silicon oxide 610 in the trench T. In the embodiment, the polysilicon 71 formed in a first trench T1 of the plurality of trenches T constitutes a gate electrode G. Thus, the silicon oxide 610 interposed between the gate electrode G and the semiconductor pillar 10 constitutes a gate insulating film 61. The polysilicon 71 formed in a second trench T2 adjacent to the first trench T1 constitutes a conductive portion 8.

Figure 6A:
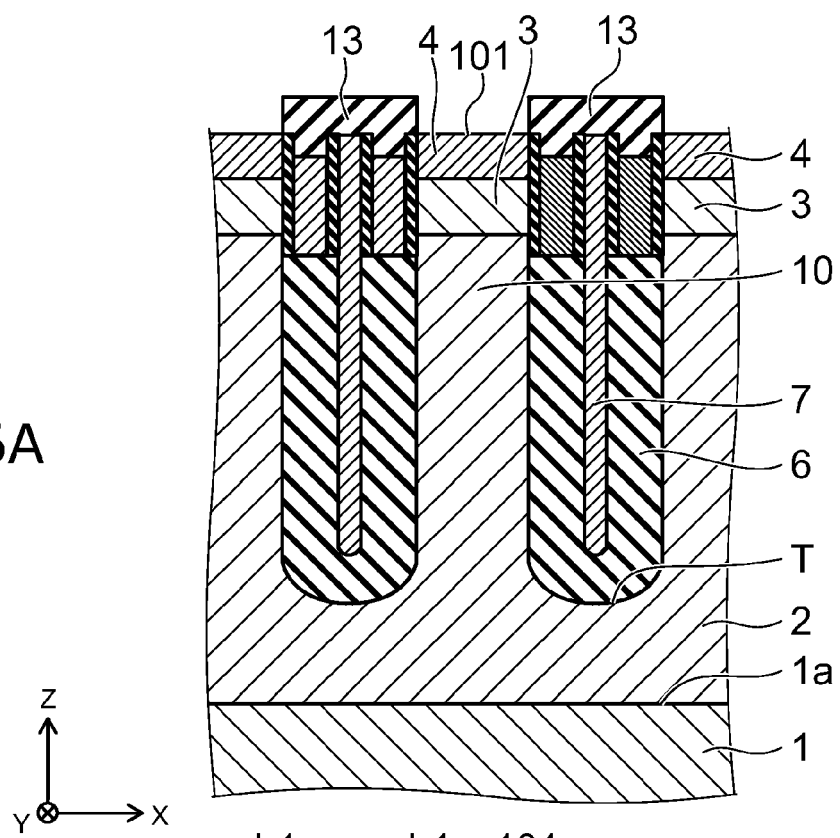

Next, as shown in FIG. 6A, silicon oxide 13 is formed so as to cover the top of the trench T. The silicon oxide 13 is formed by e.g. CVD technique. Alternatively, the silicon oxide 13 may be formed by thermal oxidation technique. The silicon oxide 13 is entirely formed so as to cover the top of the trench T and the upper end 101 of the semiconductor pillar 10. Then, by etching by RIE technique using a mask, not shown, the portion covering the upper end 101 of the semiconductor pillar 10 is removed. Thus, the silicon oxide 13 remains on the trench T as shown in FIG. 6A.

Next, the silicon oxide 13 is used as a mask to perform ion implantation of p-type impurity. Thus, a p-type base layer 3 is formed to a prescribed depth from the upper end 101 of the semiconductor pillar 10. The p-type base layer 3 is opposed to the gate electrode G across the gate insulating film 61.

Then, the silicon oxide 13 is used as a mask to perform ion implantation of n-type impurity. Thus, a region constituting an $n^+$-type source layer 4 is formed on the p-type base layer 3. The dose amount in this ion implantation is set so that the n-type impurity concentration of the $n^+$-type source layer 4 is higher than the n-type impurity concentration of the $n^-$-type drift layer 2. Part of the $n^+$-type source layer 4 is opposed to the gate electrode G across the gate insulating film 61.

Figure 6B:
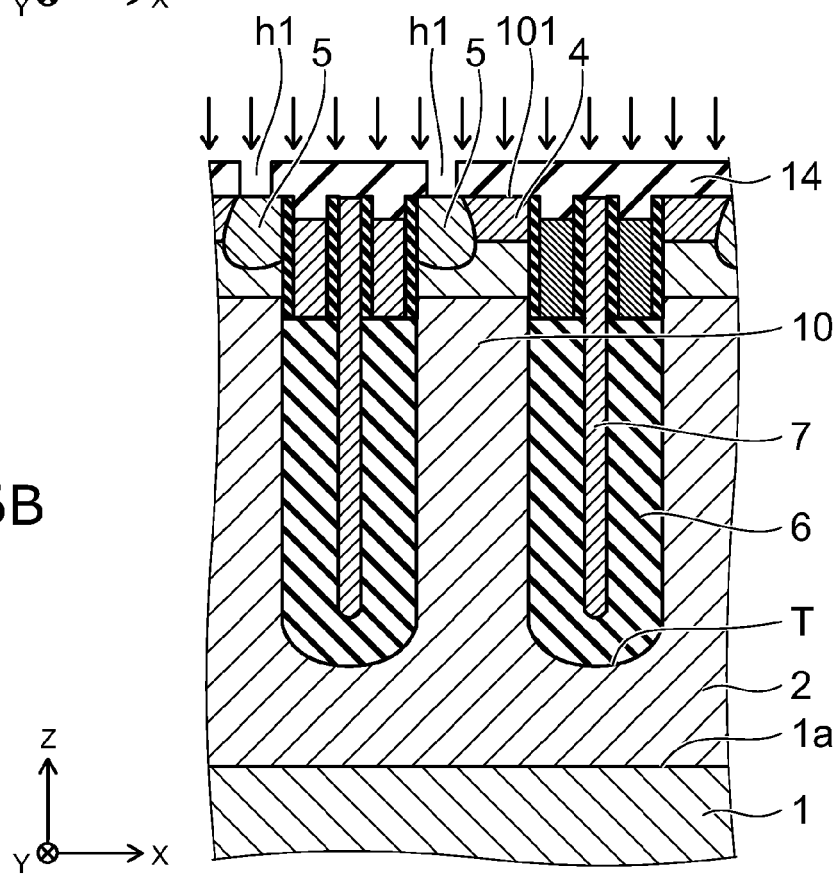

Next, as shown in FIG. 6B, silicon oxide 14 is formed so as to cover the trench T and part of the top of the semiconductor pillar 10. The silicon oxide 14 is formed by e.g. CVD technique. Alternatively, the silicon oxide 14 may be formed by e.g. thermal oxidation technique. The silicon oxide 14 is entirely formed so as to cover the top of the trench T and the upper end 101 of the semiconductor pillar 10. Then, by etching by RIE technique using a mask, not shown, part of the portion covering the upper end 101 of the semiconductor pillar 10 is removed. Thus, an opening h1 is formed in the silicon oxide 14.

In the embodiment, the opening h1 is provided at a position displaced to the opposite side from the gate electrode G at the upper end 101 of the semiconductor pillar 10.

Next, the silicon oxide 14 is used as a mask to perform ion implantation of p-type impurity. Thus, a p$^+$-type contact layer 5 is formed to a prescribed depth from the upper end 101 of the semiconductor pillar 10. The p$^+$-type contact layer 5 is formed by counterdoping the n-type impurity of the n$^+$-type source layer 4. In the embodiment, the opening h1 of the silicon oxide 14 is provided at a position displaced to the opposite side from the gate electrode G at the upper end 101 of the semiconductor pillar 10. Thus, the p-type impurity implanted from this opening h1 is also implanted into the n$^+$-type source layer 4 from a position displaced to the opposite side from the gate electrode G at the upper end 101. Thus, the p$^+$-type contact layer 5 is formed at a position displaced to the opposite side from the gate electrode G at the upper end 101 of the semiconductor pillar 10.

In this formation of the p$^+$-type contact layer 5, the p$^+$-type contact layer 5 may be formed by ion implantation in a plurality of stages in which the dose amount of p-type impurity is gradually changed. Thus, a p$^+$-type contact layer 5 including regions 51, 52, and 53 different in impurity concentration as shown in FIG. 2B is formed.

Figure 7A:
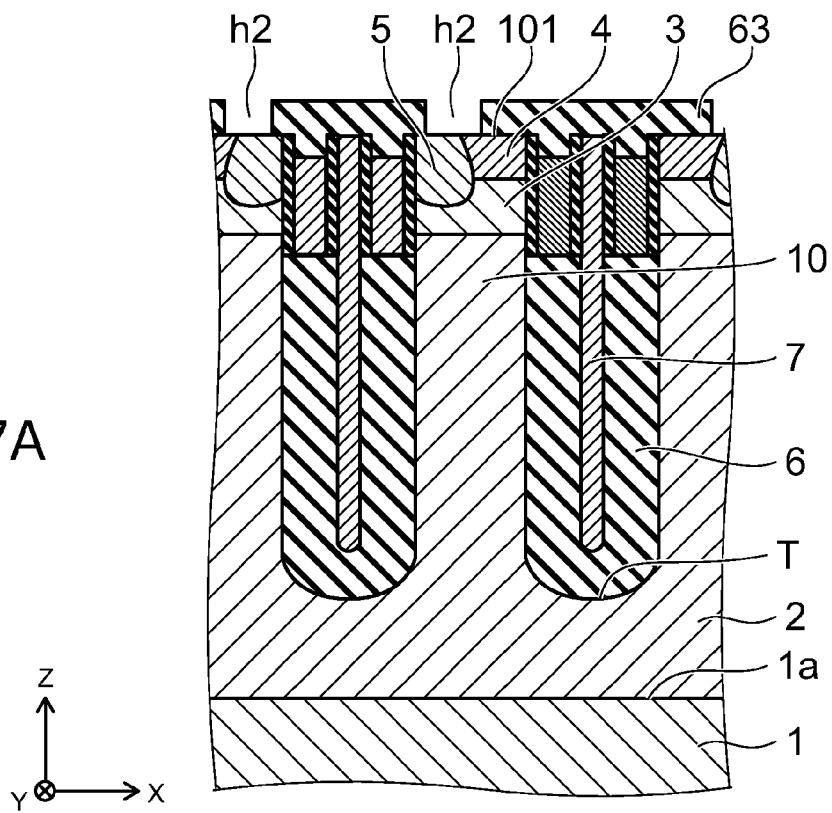

Next, as shown in FIG. 7A, an interlayer insulating film 63 made of e.g. silicon oxide is formed. The interlayer insulating film 63 is formed by e.g. CVD technique. The interlayer insulating film 63 is entirely formed so as to cover the top of the trench T and the upper end 101 of the semiconductor pillar 10. Then, by etching by RIE technique using a mask, not shown, an opening h2 is formed in the interlayer insulating film 63. The opening h2 is formed on the n$^+$-type source layer 4 and the p$^+$-type contact layer 5. The opening h2 is formed in conformity with the p$^+$-type contact layer 5 provided at a displaced position at the upper end 101 of the semiconductor pillar 10.

Figure 7B:
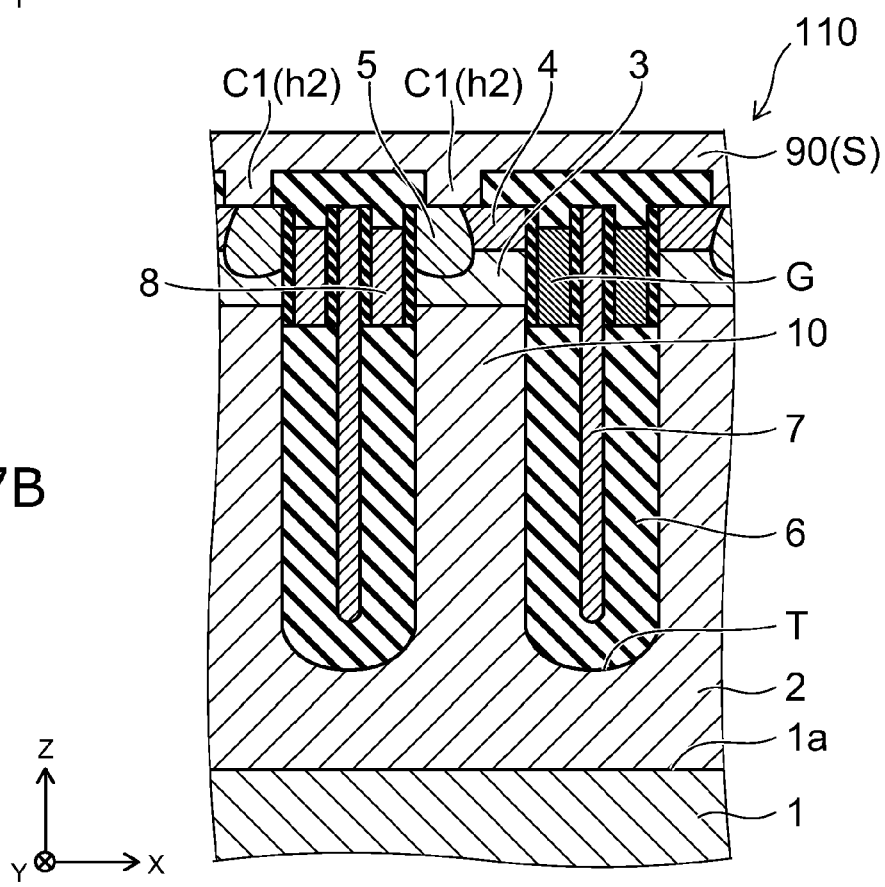

Next, as shown in FIG. 7B, an electrode material film 90 is formed. The electrode material film 90 is made of e.g. a metal material. The metal material is e.g. aluminum. The electrode material film 90 may have a multilayer structure including barrier metal. Thus, a source electrode S electrically continuous with the n$^+$-type source layer 4 and the p$^+$-type contact layer 5 is formed. Furthermore, the electrode material film 90 embedded in the opening h2 constitutes a first contact portion C1. The first contact portion C1 is formed at the position of the opening h2. That is, the first contact portion C1 is formed at a position displaced to the opposite side from the gate electrode G at the upper end 101 of the semiconductor pillar 10.

By these steps, the semiconductor device 110 is completed.

In the semiconductor device 110, the p$^+$-type contact layer 5 is displaced to the opposite side from the gate electrode G at the upper end 101 of the semiconductor pillar 10. This results in a margin sufficient for aligning the mask for forming the opening h2 shown in FIG. 7A. For instance, in the case where gate electrodes G are provided on both sides of the semiconductor pillar 10, the p$^+$-type contact layer 5 needs to be formed in the central portion of the upper end 101 of the semiconductor pillar 10, and the n$^+$-type source layer 4 needs to be formed on both sides thereof. In this case, the alignment accuracy of the mask for forming the p$^+$-type contact layer 5 needs to be sufficiently smaller (e.g., 0.3 μm or less) than ⅓ of the length in the X direction of the upper end 101. In contrast, in the semiconductor device 110, the p$^+$-type contact layer 5 is provided only on one side of the upper end 101. Thus, a certain degree of misalignment does not affect the channel formation region. Accordingly, high accuracy is not required (e.g., approximately 2.0 μm or less) for alignment of the mask for forming the p$^+$-type contact layer 5.

Second Embodiment

Next, a semiconductor device according to a second embodiment is described.

Figure 8:
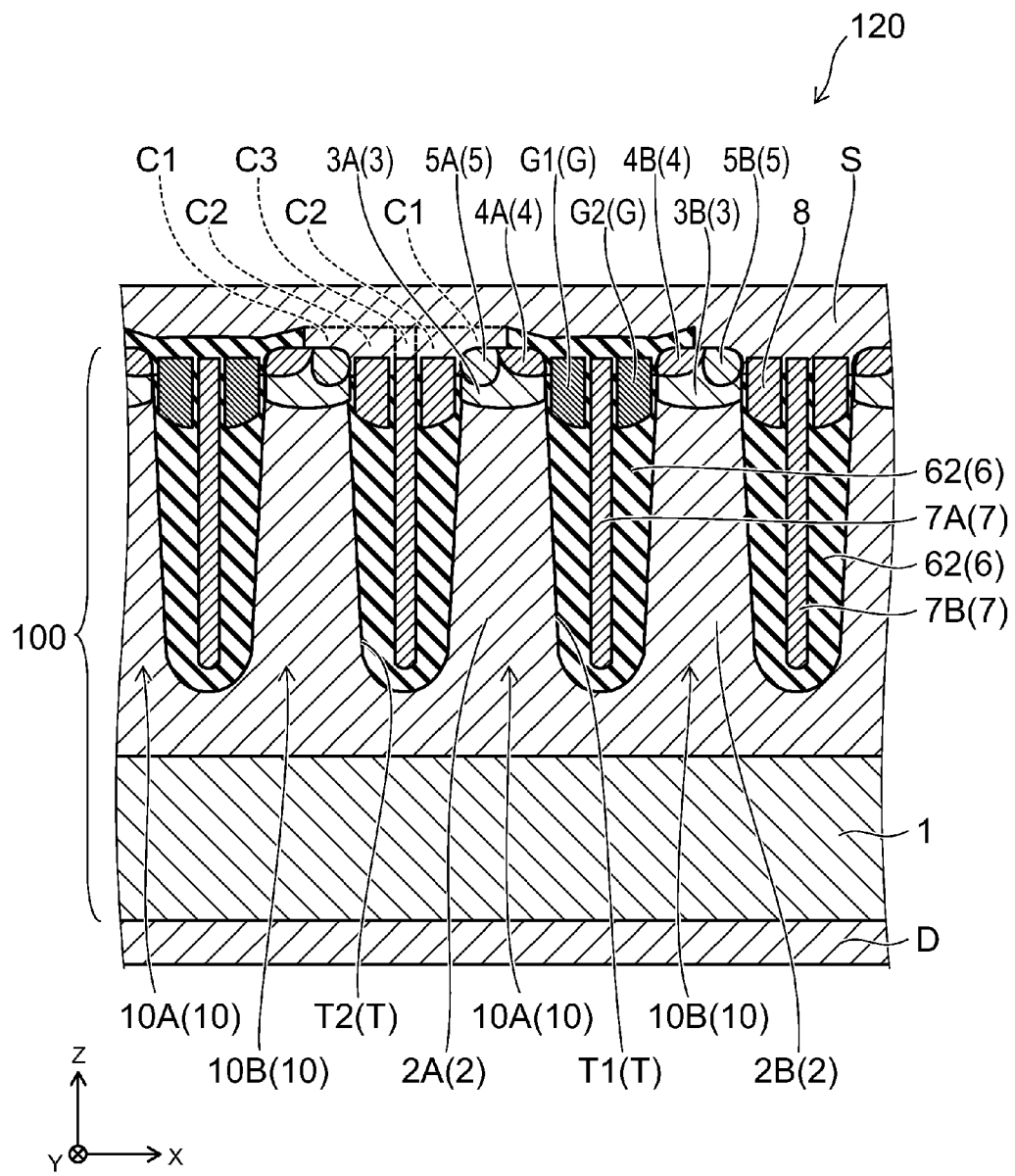
FIG. 8 is a schematic sectional view illustrating the configuration of a semiconductor device according to a second embodiment.

FIG. 8 is a schematic sectional view illustrating the configuration of the semiconductor device according to the second embodiment.

As shown in FIG. 8, the semiconductor device 120 according to the second embodiment includes a second contact portion C2 provided between the source electrode S and the conductive portion 8 provided in the second trench T2. The semiconductor device 120 further includes a third contact portion C3 provided between the source electrode and the second field plate electrode 7B provided in the second trench T2. The rest of the configuration is similar to that of the semiconductor device 110.

It is possible to provide only one of the second contact portion C2 and the third contact portion C3, or to provide both of them. The first contact portion C1, the second contact portion C2, and the third contact portion C3 may be connected in the X direction. The second contact portion C2 and the third contact portion C3 extend in the Y direction. The second contact portion C2 and the third contact portion C3 are made of a metal material similar to the material of the source electrode S. Alternatively, besides the metal material, the second contact portion C2 and the third contact portion C3 may be made of conductive polysilicon.

The semiconductor device 120 can be manufactured by changing the position and size of the opening h2 in conformity with the second contact portion C2 and the third contact portion C3 in the process for manufacturing the semiconductor device 110 shown in FIGS. 7A and 7B. The size of the opening h2 formed in the process for manufacturing the semiconductor device 120 is larger than the size of the opening h2 formed in the process for manufacturing the semiconductor device 110. This results in a larger margin for the alignment accuracy of the mask for forming the opening h2 than that for the semiconductor device 110.

Such a semiconductor device 120 achieves a function and effect similar to those of the semiconductor device 110. In addition, in the semiconductor device 120, the electrical resistance throughout the interconnection equipotential with the source electrode S is smaller than in the case where the second contact portion C2 and the third contact portion C3 are not provided.

Here, the conductive portion 8 and the second field plate electrode 7B are formed from conductive polysilicon. Thus, they have larger resistance than metal material. If the second contact portion C2 and the third contact portion C3 are not provided between the conductive portion 8 or the second field plate electrode 7B and the source electrode S, the electrical resistance throughout the interconnection equipotential with the source electrode S, including the conductive portion 8 and the second field plate electrode 7B, is made larger. Large electrical resistance throughout the interconnection equipotential with the source electrode S degrades the characteristics of the semiconductor device, such as causing self turn-on.

In the embodiment, the second contact portion C2 is provided between the conductive portion 8 and the source electrode S. The third contact portion C3 is provided between the second field plate electrode 7B and the source electrode S. This decreases the electrical resistance throughout the interconnection equipotential with the source electrode S, including the conductive portion 8 and the second field plate electrode 7B. Thus, the degradation of the characteristics of the semiconductor device is suppressed.

Furthermore, in such a semiconductor device 120, because the second contact portion C2 and the third contact portion C3 are provided, there is no need for vertical interconnection for making the conductive portion 8 and the second field plate electrode 7B continuous with the source electrode S.

Figure 9A:
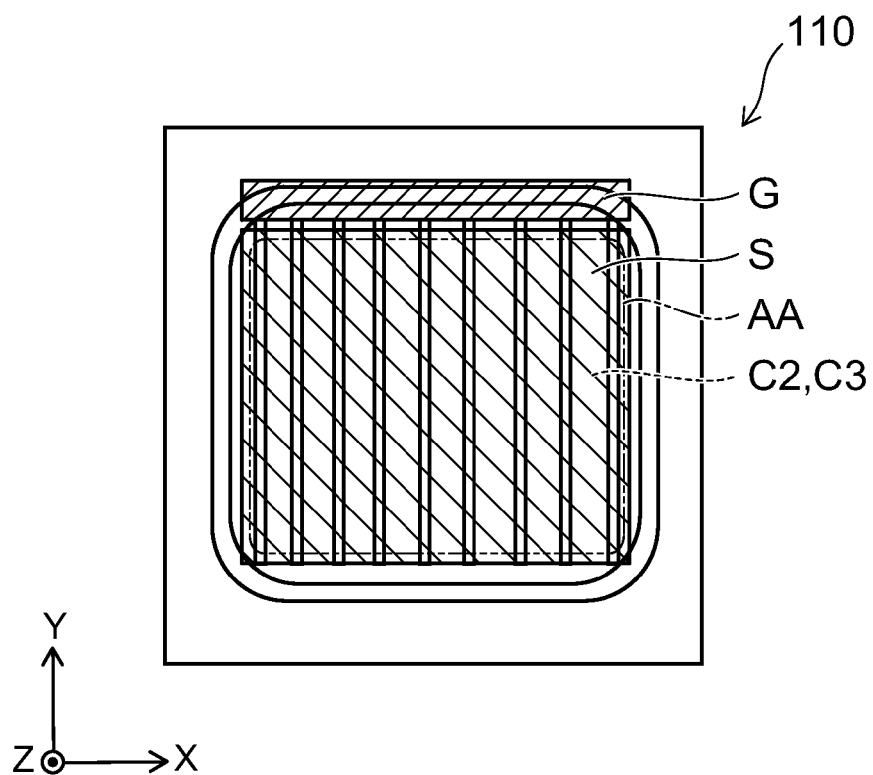
FIGS. 9A and 9B are schematic plan views of semiconductor devices.
Figure 9B:
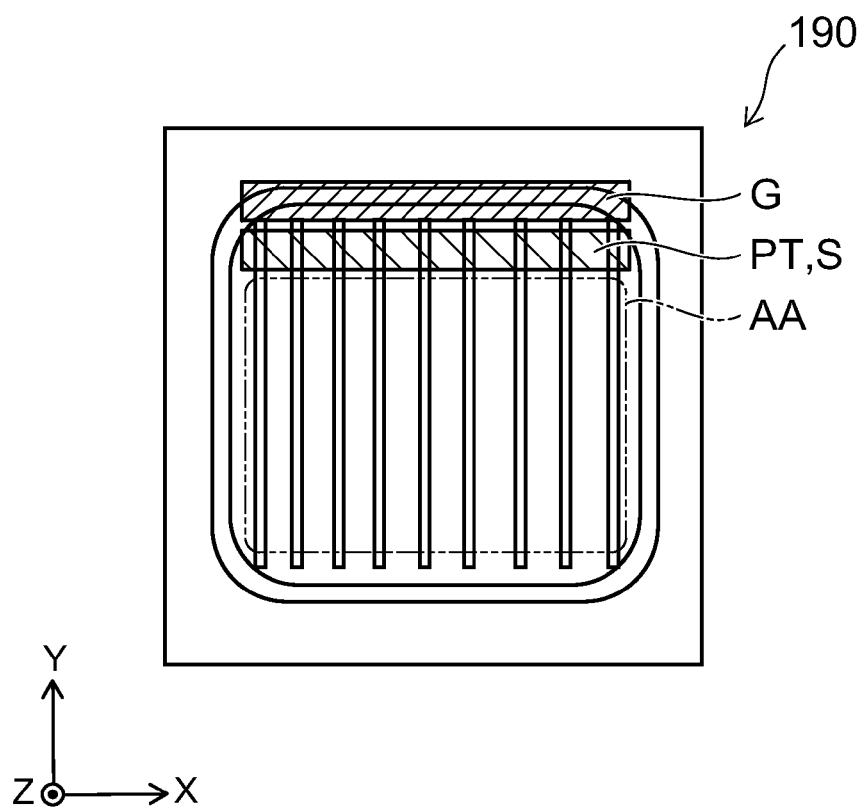

FIGS. 9A and 9B are schematic plan views of semiconductor devices.

FIG. 9A is a schematic plan view of the semiconductor device 120. FIG. 9B is a schematic plan view of a semiconductor device 190 according to a reference example. Each figure schematically shows a plan view of the semiconductor device 120, 190 formed like a rectangular chip.

As shown in FIG. 9B, the semiconductor device 190 according to the reference example does not include the second contact portion C2 and the third contact portion C3. Thus, in the semiconductor device 190, a vertical interconnection PT for connecting the source electrode S to the conductive portion 8 and the second field plate electrode 7B is provided in the peripheral region outside the device region AA functioning as transistors.

In contrast, as shown in FIG. 9A, the semiconductor device 120 according to the embodiment includes the second contact portion C2 and the third contact portion C3 inside the device region AA. Thus, there is no need to provide a vertical interconnection PT outside the device region AA. That is, in the semiconductor device 120, the device region AA is larger than in the semiconductor device 190.

Furthermore, in the semiconductor device 120, because there is no need for a vertical interconnection PT outside the device region AA, there is no need for the photolithography step for forming the vertical interconnection PT. Furthermore, because there is no vertical interconnection PT, the cause of failures in resist application due to the presence of the vertical interconnection PT is excluded. That is, because there is no vertical interconnection PT, the resist is applied on a flatter surface. This improves the accuracy of the photolithography step.

Third Embodiment

Next, a semiconductor device according to a third embodiment is described.

Figure 10A:
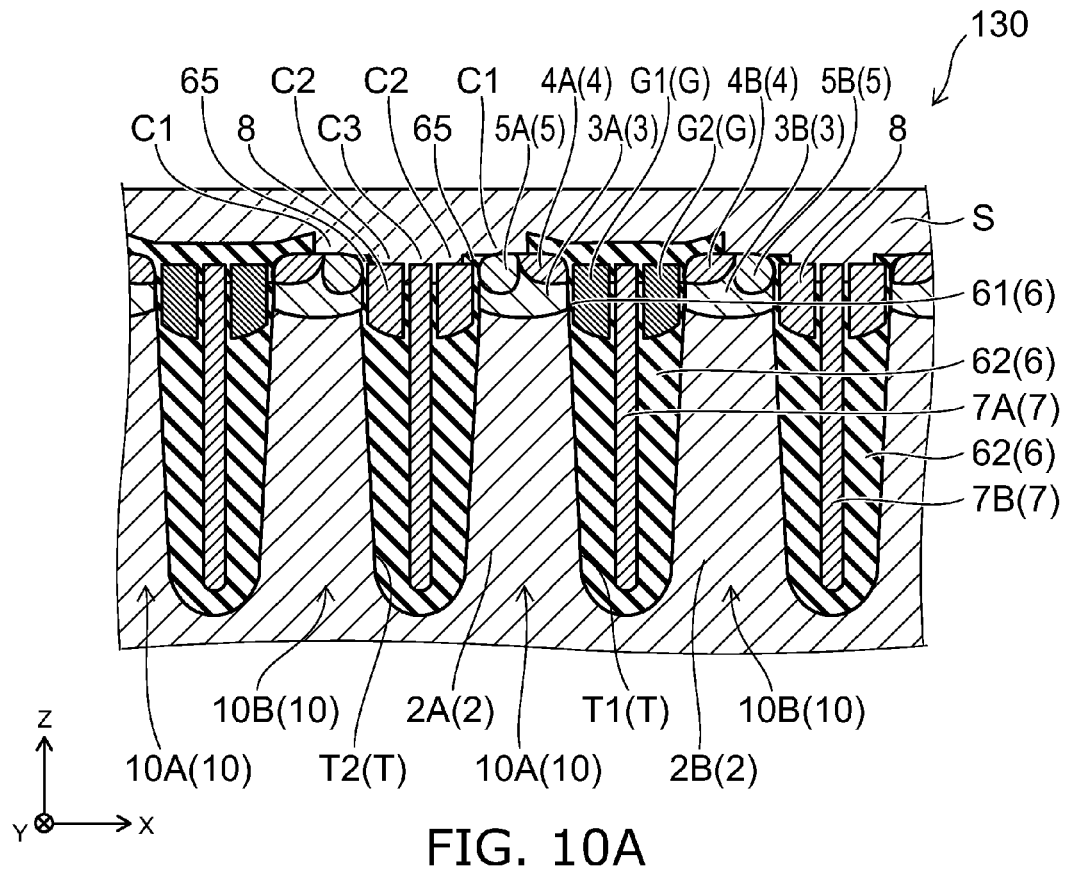
FIGS. 10A and 10B are schematic views illustrating the configuration of a semiconductor device according to a third embodiment.
Figure 10B:
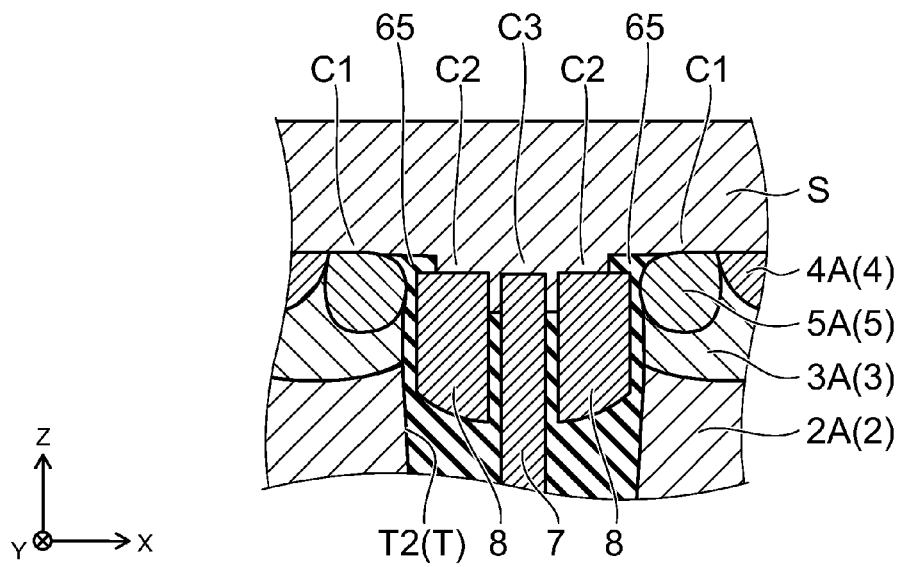

FIGS. 10A and 10B are schematic sectional views illustrating the configuration of the semiconductor device according to the third embodiment.

FIG. 10A shows a schematic sectional view of the semiconductor device 130. FIG. 10B shows a partial enlarged view of the semiconductor device 130.

As shown in FIGS. 10A and 10B, the semiconductor device 130 according to the third embodiment includes an insulating film 65 in addition to the configuration of the semiconductor device 120 according to the second embodiment.

The insulating film 65 is provided between the side surface 8s of the conductive portion 8 and the p$^+$-type contact layer 5. The semiconductor device 130 including such an insulating film 65 can be manufactured by etching the interlayer insulating film 63 in e.g. two stages in the process for manufacturing the semiconductor device 110 shown in FIGS. 7A and 7B.

In the semiconductor device 130, the insulating film 65 is provided. Thus, in forming the first contact portion C1 and the second contact portion C2, the insulating film 65 serves as a barrier to suppress the influence on the semiconductor pillar 10. For instance, in the case where the first contact portion C1 and the second contact portion C2 are made of a metal material (e.g., aluminum), reaction (such as aluminum spike) of this metal material with the semiconductor pillar 10 is suppressed by the insulating film 65.

Fourth Embodiment

Next, a semiconductor device according to a fourth embodiment is described.

Figure 11:
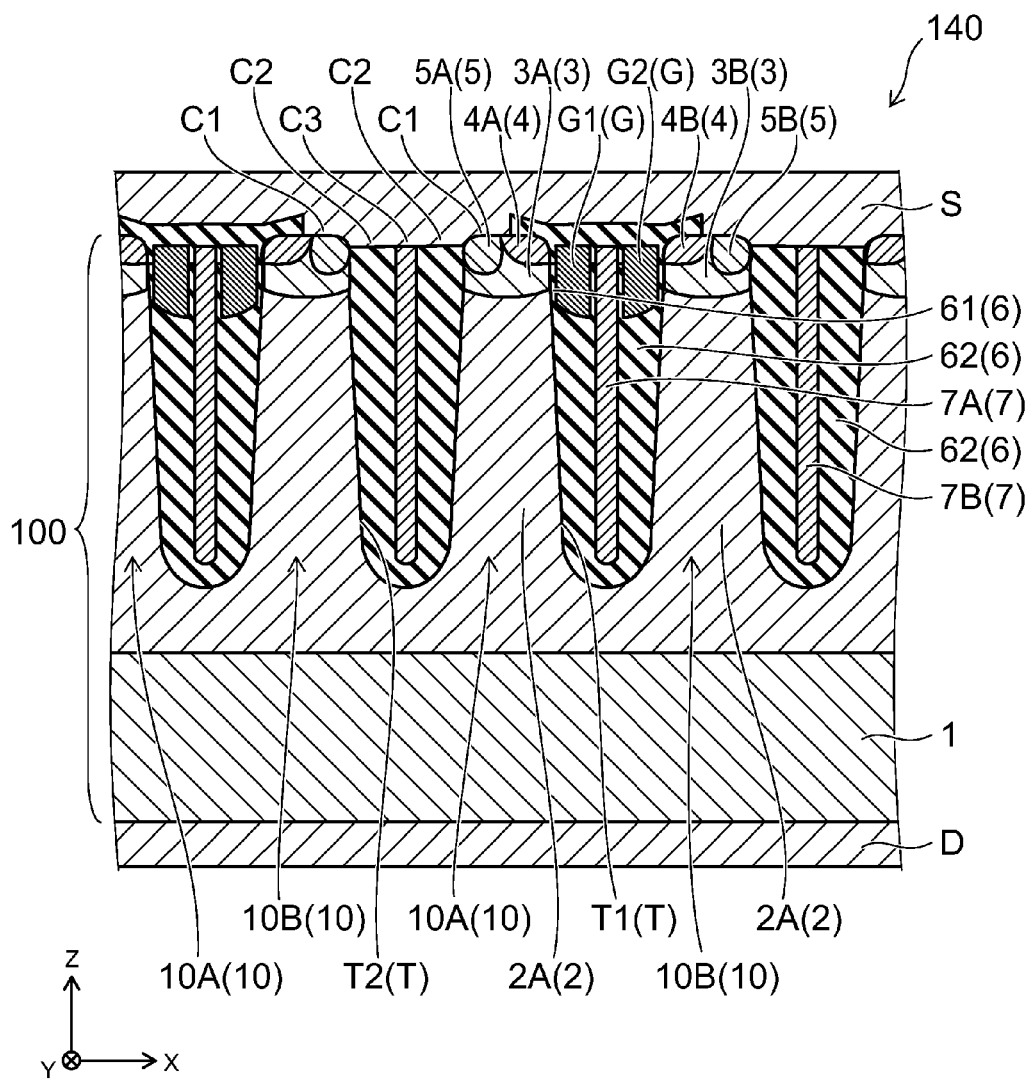
FIG. 11 is a schematic sectional view illustrating the configuration of a semiconductor device according to a fourth embodiment.

FIG. 11 is a schematic sectional view illustrating the configuration of the semiconductor device according to the fourth embodiment.

As shown in FIG. 11, the semiconductor device 140 according to the fourth embodiment is different from the semiconductor device 120 according to the second embodiment shown in FIG. 8 in that the conductive portion 8 is not provided in the second trench T2. The rest of the configuration is similar to that of the semiconductor device 120.

The semiconductor device 140 can be manufactured as follows. In the process for manufacturing the semiconductor device 110 shown in FIG. 5B, after polysilicon 71 is embedded in the trenches T, only the polysilicon 71 embedded in the second trench T2 is removed. Then, silicon oxide, for instance, also constituting the field plate insulating film 62, is embedded in the second trench T2 from which the polysilicon 71 has been removed. The subsequent steps are similar to those of the process for manufacturing the semiconductor device 120.

In the semiconductor device 140, the conductive portion 8 is not provided in the second trench T2. Thus, the upper end surface of the insulating film 6 embedded in the second trench T2 is planarized more easily. This facilitates ensuring the contact between the second contact portion C2 and the second field plate electrode 7B.

Fifth Embodiment

Next, a semiconductor device according to a fifth embodiment is described.

Figure 12:
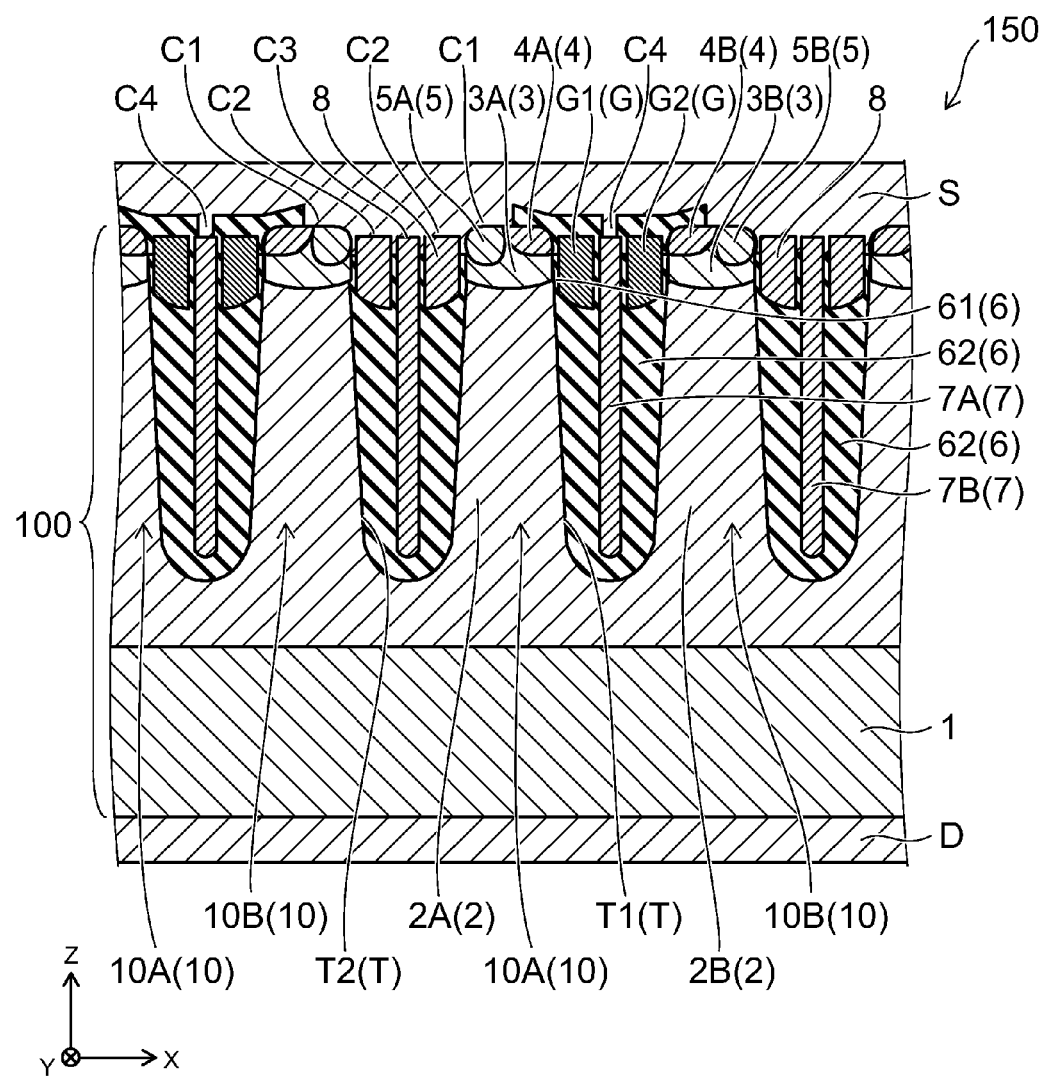
FIG. 12 is a schematic sectional view illustrating the configuration of a semiconductor device according to a fifth embodiment.

FIG. 12 is a schematic sectional view illustrating the configuration of the semiconductor device according to the fifth embodiment.

As shown in FIG. 12, the semiconductor device 150 according to the fifth embodiment includes a fourth contact portion C4 provided between the source electrode S and the first field plate electrode 7A. The rest of the configuration is similar to that of the semiconductor device 120 according to the second embodiment.

The semiconductor device 150 can be manufactured by adding an opening h2 corresponding to the position of the fourth contact portion C4 in the process for manufacturing the semiconductor device 110 shown in FIGS. 7A and 7B.

Such a semiconductor device 150 achieves a function and effect similar to those of the semiconductor device 120. In addition, in the semiconductor device 150, the electrical resistance throughout the interconnection equipotential with the source electrode S is smaller than in the case where the fourth contact portion C4 is not provided. This suppresses degradation (such as self turn-on) of the characteristics of the semiconductor device.

(Variations)

Next, variations of the semiconductor device according to the embodiments are described.

Figure 13:
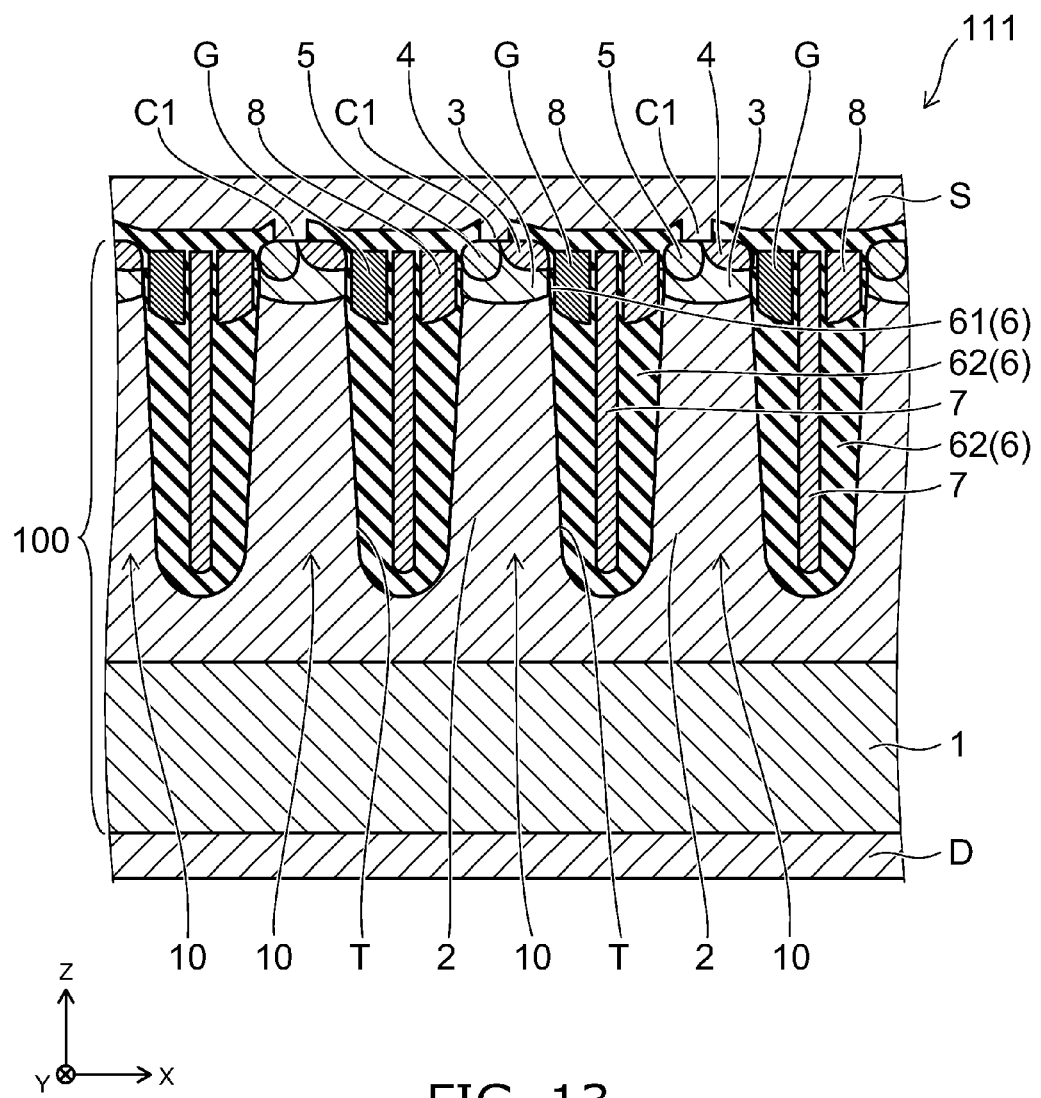
FIGS. 13 to 15 are schematic sectional views showing variations.
Figure 14:
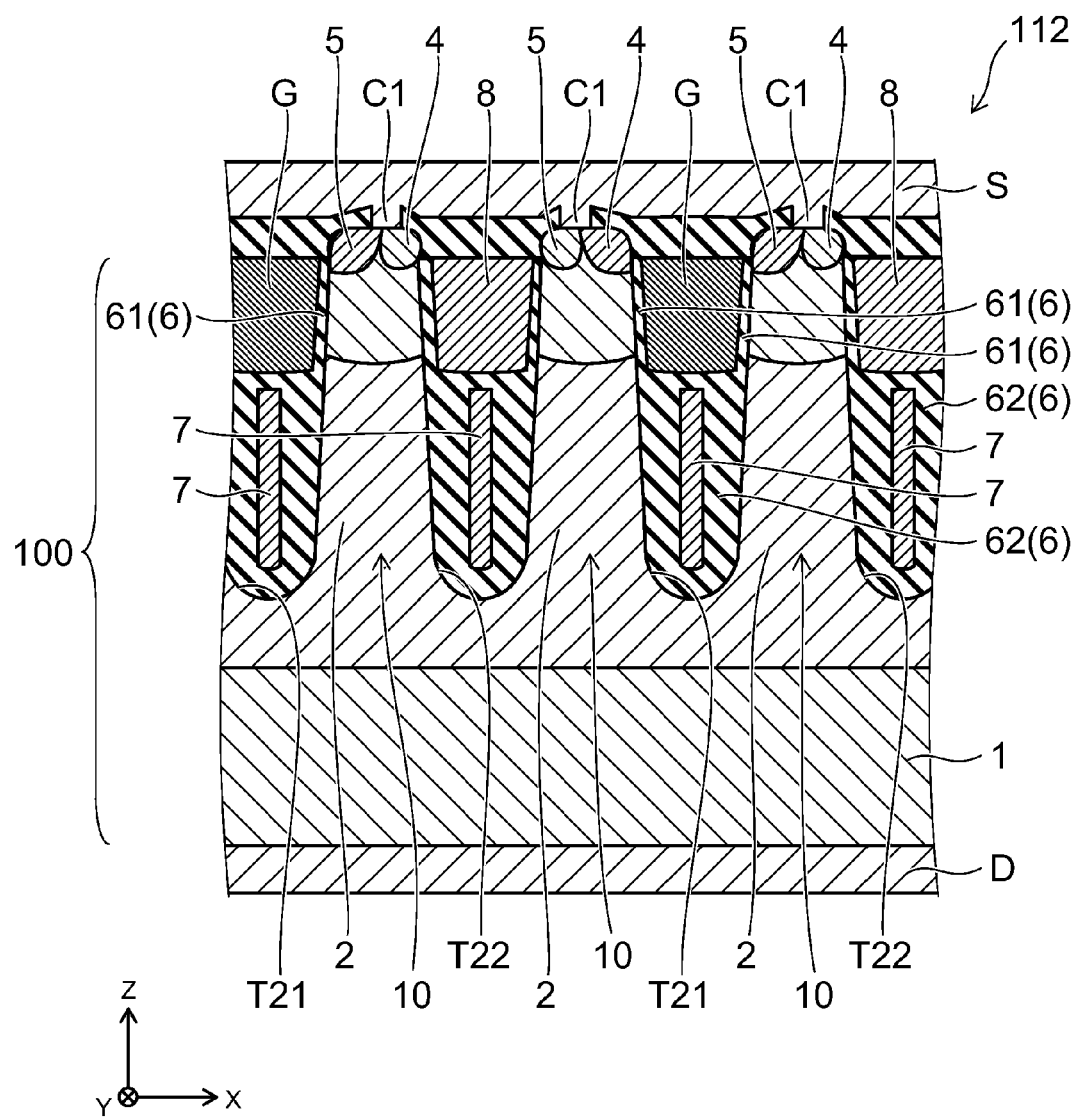
Figure 15:
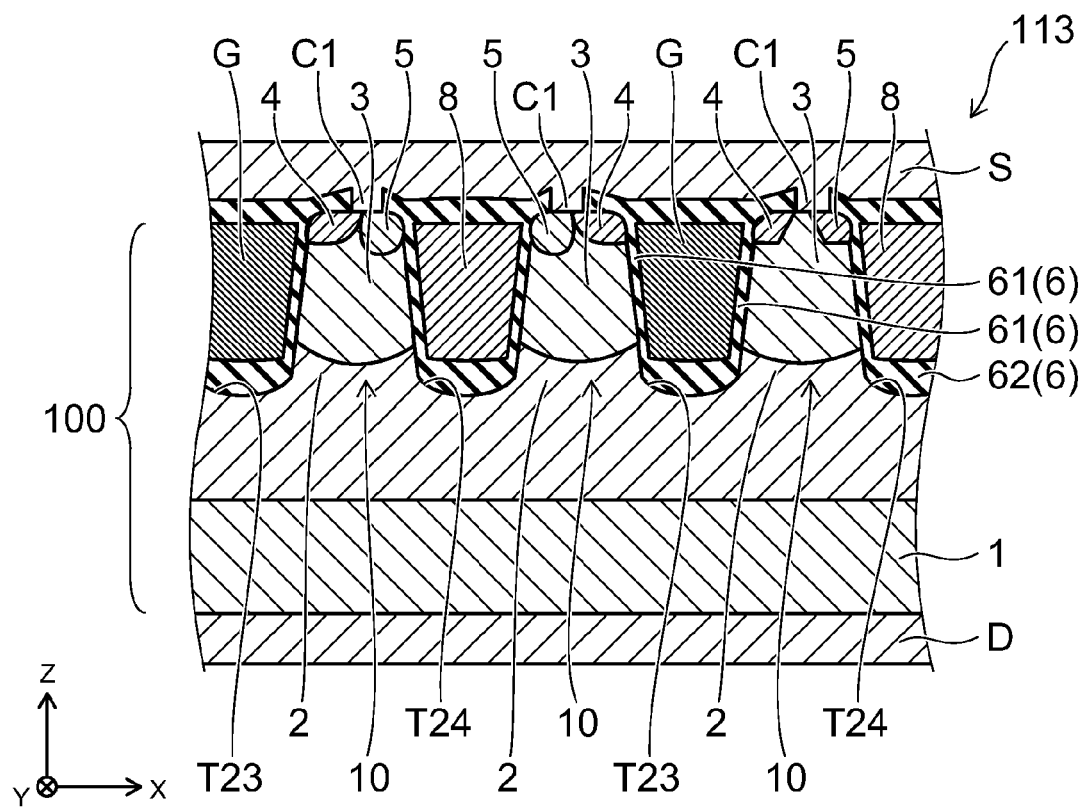

FIGS. 13 to 15 are schematic sectional views showing the variations.

FIG. 13 shows a semiconductor device 111 according to a first variation. FIG. 14 shows a semiconductor device 112 according to a second variation. FIG. 15 shows a semiconductor device 113 according to a third variation.

In the semiconductor device 111 shown in FIG. 13, the configuration in the trench T10 is different from the configuration in the trench T of the semiconductor device 110 according to the first embodiment. In the trench T10, a field plate electrode 7, a gate electrode G, and a conductive portion 8 are provided. The field plate electrode 7 extends in the Z direction in the central portion of the trench T10. The gate electrode G is provided on one side in the X direction with respect to the field plate electrode 7 centered in the trench T10. The conductive portion 8 is provided on the other side (on the opposite side from the gate electrode G) in the X direction with respect to the field plate electrode 7 centered in the trench T10.

In the semiconductor device 111, a plurality of trenches T10 are provided. The plurality of trenches T10 have the same internal structure. In the semiconductor device 111, the $p^+$-type contact layer 5 is displaced to the opposite side of the semiconductor pillar 10 from the gate electrode G. In the semiconductor device 111, a plurality of trenches T10 having the same internal structure and a plurality of semiconductor pillars 10 having the same structure are disposed alternately in the X direction.

In the semiconductor device 112 shown in FIG. 14, a gate electrode G is provided in the trench T21, and a conductive portion 8 is provided in the trench T22. The field plate electrode 7 provided in the trenches T21 and T22 is provided below the lower end of the gate electrode G or the conductive portion 8.

The semiconductor device 112 includes a plurality of trenches T21 and a plurality of trenches T22. In the semiconductor device 112, the plurality of trenches T21 and the plurality of trenches T22 are disposed alternately in the X direction. In the semiconductor pillar 10 provided between the trench T21 and the trench T22, the $p^+$-type contact layer 5 is displaced to the opposite side of the semiconductor pillar 10 from the gate electrode G.

In the semiconductor device 113 shown in FIG. 15, a gate electrode G is provided in the trench T23, and a conductive portion 8 is provided in the trench T24. In the semiconductor device 113, the field plate electrode 7 shown in FIG. 14 is not provided. Thus, the depth of the trenches T23 and T24 of the semiconductor device 113 is shallower than the depth of the trenches T21 and T22 of the semiconductor device 112.

The semiconductor device 113 includes a plurality of trenches T23 and a plurality of trenches T24. In the semiconductor device 113, the plurality of trenches T23 and the plurality of trenches T24 are disposed alternately in the X direction. In the semiconductor pillar 10 provided between the trench T23 and the trench T24, the $p^+$-type contact layer 5 is displaced to the opposite side of the semiconductor pillar 10 from the gate electrode G.

Next, an application example of the semiconductor device according to the embodiments is described.

The following application example illustrates the case of using the semiconductor device 110. However, the application example is also applicable to the semiconductor devices 111, 112, 113, 120, 130, 140, and 150.

Figure 16:
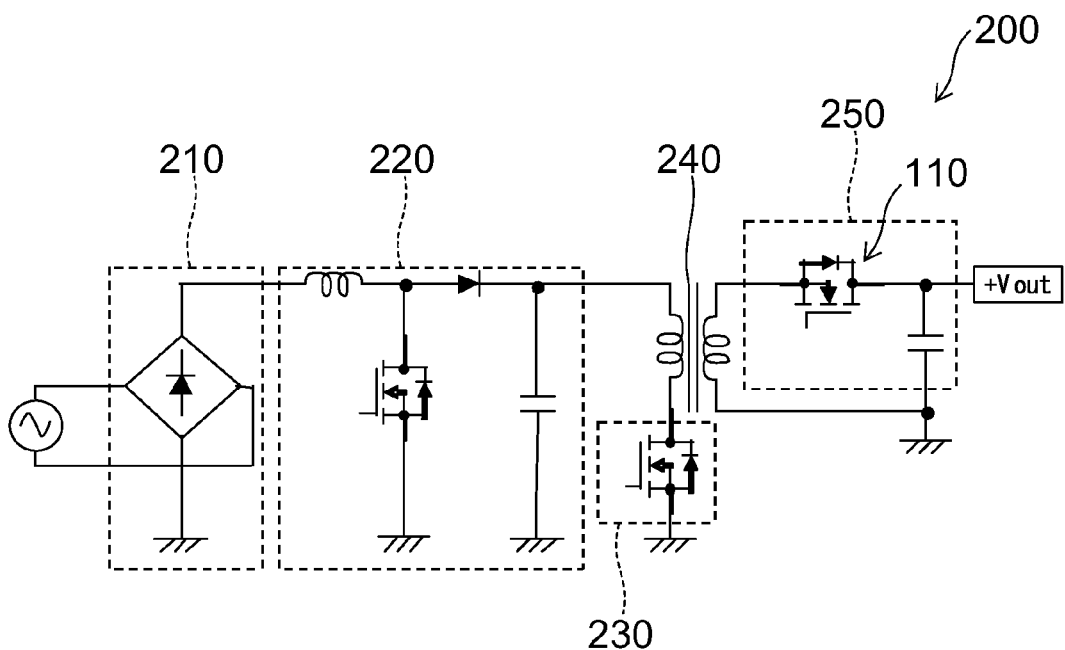
FIG. 16 is a circuit diagram showing the application example of the semiconductor device.

FIG. 16 is a circuit diagram showing the application example of the semiconductor device.

FIG. 16 shows a flyback circuit 200. As shown in FIG. 16, the flyback circuit 200 includes a bridge circuit 210, a PFC (Power Factor Correction) circuit 220, a switch circuit 230, a transformer 240, and a synchronous rectification circuit 250. The bridge circuit 210, the PFC circuit 220, and the switch circuit 230 are provided on the primary side of the transformer 240. The synchronous rectification circuit 250 is provided on the secondary side of the transformer 240. Such a flyback circuit 200 is applied to e.g. a power supply device (such as DC-DC converter).

The semiconductor device 110 according to the embodiment is applied to e.g. the synchronous rectification circuit 250. By applying the semiconductor device 110 to the synchronous rectification circuit 250, the loss due to ON voltage is suppressed to e.g. approximately 1/7 of the case of applying a diode to the synchronous rectification circuit 250. Thus, the power loss of a power supply device and the like based on the flyback circuit 200 is reduced. Furthermore, by applying the semiconductor device 110, power supply devices and the like with stable characteristics are provided.

As described above, the semiconductor device according to the embodiments can achieve stable characteristics.

The embodiments and the variations thereof have been described above. However, the invention is not limited to these examples. For instance, those skilled in the art can modify the above embodiments or the variations thereof by suitable addition, deletion, and design change of components, and by suitable combination of the features of the embodiments and the variations. Such modifications are also encompassed within the scope of the invention as long as they fall within the spirit of the invention.

For instance, in the description of the above embodiments and variations, the first conductivity type is n-type, and the second conductivity type is p-type. However, the invention is also practicable when the first conductivity type is p-type and the second conductivity type is n-type.

In the description of the above embodiments and variations, silicon (Si) is used as an example of the semiconductor. However, the semiconductor may be e.g. a compound semiconductor such as silicon carbide (SiC) or gallium nitride (GaN), or a wide bandgap semiconductor such as diamond.

Furthermore, in the description of the above embodiments and variations, a MOS transistor is taken as an example. However, the invention is not limited thereto. The semiconductor device is also applicable to e.g. IGBT (Insulated Gate Bipolar Transistor) and IEGT (Injection Enhanced Gate Transistor).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
  a semiconductor section having a first trench and a second trench spaced apart from the first trench;
  a first control electrode provided in the first trench and across a first insulating film from the semiconductor section;
  a second control electrode provided in the first trench and spaced apart from the first control electrode;
  a first electrode provided in the second trench and across a second insulating film from the semiconductor section;
  a second electrode provided in the second trench and spaced apart from the first electrode; and
  a third electrode provided on the semiconductor section, wherein the semiconductor section comprises:

a first semiconductor region of a first conductivity type provided between the first trench and the second trench;
a second semiconductor region of a second conductivity type provided on the first semiconductor region and opposed to the first control electrode;
a third semiconductor region of the first conductivity type provided on the second semiconductor region; and
a fourth semiconductor region of the second conductivity type provided on the second semiconductor region and having an impurity concentration higher than an impurity concentration of the second semiconductor region, and
wherein the fourth semiconductor region is provided to contact with the second insulating film.

2. The device according to claim 1, further comprising a first field plate electrode provided between the first control electrode and the second control electrode in the first trench.

3. The device according to claim 2, wherein a lower end of the first field plate electrode is located below lower ends of the first control electrode and the second control electrode.

4. The device according to claim 1, wherein a position of a boundary between the third semiconductor region and the fourth semiconductor region at an upper end of the semiconductor section is located away from the first trench by half or more of a length between the first trench and the second trench.

5. The device according to claim 1, wherein the fourth semiconductor region includes a first region on a side of an upper end of the semiconductor section, and a second region in contact with the first region and having an impurity concentration higher than an impurity concentration of the first region.

6. The device according to claim 1, wherein a depth of the fourth semiconductor region is larger than a depth of the third semiconductor region.

7. The device according to claim 1, further comprising a second field plate electrode provided between the first electrode and the second electrode in the second trench.

8. The device according to claim 1, wherein the first electrode and the second electrode are electrically continuous with the third semiconductor region.

9. A semiconductor device comprising:
a semiconductor layer;
a first control electrode provided in the semiconductor layer;
a second control electrode provided in the semiconductor layer and spaced from the first control electrode;
a first insulating region surrounding the first control electrode and the second control electrode so as to insulate the first control electrode and the second control electrode from the semiconductor layer;
a first electrode provided in the semiconductor layer;
a second electrode provided in the semiconductor layer and spaced from the first electrode;
a second insulating region surrounding the first electrode and the second electrode so as to insulate the first electrode and the second electrode from the semiconductor layer;
a first semiconductor region of a first conductivity type provided between the first insulating region and the second insulating region;
a second semiconductor region of a second conductivity type provided on the first semiconductor region and opposed to the first control electrode;
a third semiconductor region of the first conductivity type provided on the second semiconductor region; and
a fourth semiconductor region of the second conductivity type provided on the second semiconductor region and having an impurity concentration higher than an impurity concentration of the second semiconductor region;
wherein the fourth semiconductor region being provided to contact with the second insulating region.

10. The device according to claim 9, further comprising a first field plate electrode provided between the first control electrode and the second control electrode, wherein the first insulating region surrounds the first field plate electrode so as to insulate the first field plate electrode from the semiconductor layer.

11. The device according to claim 10, wherein a lower end of the first field plate electrode is located below lower ends of the first control electrode and the second control electrode.

12. The device according to claim 9, wherein a position of a boundary between the third semiconductor region and the fourth semiconductor region at an upper end of the semiconductor layer is located away from the first insulating region by half or more of a length between the first insulating region and the second insulating region.

13. The device according to claim 9, wherein the fourth semiconductor region includes a first region on a side of an upper end of the semiconductor layer, and a second region in contact with the first region and having an impurity concentration higher than an impurity concentration of the first region.

14. The device according to claim 9, further comprising a second field plate electrode provided between the first electrode and the second electrode, wherein the second insulating region surrounds the second filed plate electrode so as to insulate the second field plate electrode from the semiconductor layer.

15. The device according to claim 9, wherein the first electrode and the second electrode are electrically continuous with the third semiconductor region.

16. A semiconductor device comprising:
a semiconductor section extending in a first direction;
a control electrode provided across a first insulating film from the semiconductor section in a second direction orthogonal to the first direction;
a first electrode provided on the semiconductor section; and
a conductive portion provided across a second insulating film from the opposite side of the semiconductor section from the control electrode,
the semiconductor section including:
a first semiconductor region of a first conductivity type;
a second semiconductor region of a second conductivity type provided on the first semiconductor region and opposed to the control electrode;
a third semiconductor region of the first conductivity type provided on the second semiconductor region; and
a fourth semiconductor region of the second conductivity type provided on the second semiconductor region and having an impurity concentration higher than an impurity concentration of the second semiconductor region;
wherein the fourth semiconductor region is provided to be displaced to the opposite side of the semiconductor section from the control electrode, and
wherein the conductive portion is electrically continuous with the third semiconductor region.

17. The device according to claim 16, further comprising a second contact portion provided between the first electrode and the conductive portion.

\* \* \* \* \*